(12) United States Patent
Little et al.

(10) Patent No.: US 10,588,243 B2
(45) Date of Patent: Mar. 10, 2020

(54) ELECTRICAL CONNECTOR ASSEMBLY EQUIPPED WITH HEAT SINKS AND ADDITIONAL HEAT PIPE CONNECTED THEREBETWEEN

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventors: Terrance F. Little, Fullerton, CA (US); Joe-Fu Chen, Irvine, CA (US)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 16/159,718

(22) Filed: Oct. 15, 2018

(65) Prior Publication Data

US 2019/0116692 A1 Apr. 18, 2019

Related U.S. Application Data

(60) Provisional application No. 62/572,407, filed on Oct. 13, 2017, provisional application No. 62/635,508, filed on Feb. 26, 2018.

(51) Int. Cl.
*H05K 7/20* (2006.01)
*G02B 6/42* (2006.01)
(Continued)

(52) U.S. Cl.
CPC ....... *H05K 7/20418* (2013.01); *G02B 6/4269* (2013.01); *H01R 12/722* (2013.01); *H01R 13/502* (2013.01); *H01R 13/6581* (2013.01); *H01R 13/6594* (2013.01); *H01R 24/60* (2013.01); *H05K 7/20436* (2013.01); *H05K 9/0024* (2013.01)

(58) Field of Classification Search
CPC .......................................... G02B 6/4268–4269
See application file for complete search history.

(56) References Cited

U.S. PATENT DOCUMENTS 9,407,028 B2 8/2016 Tyco
9,518,785 B2 * 12/2016 Szczesny ............ F28D 15/0275
(Continued)

OTHER PUBLICATIONS

QDFP-DD Specification for QSFP Double Density 8X Pluggable Transceiver Rev 0.1 Mar. 8, 2016.

*Primary Examiner* — Robert J Hoffberg
(74) *Attorney, Agent, or Firm* — Wei Te Chung; Ming Chieh Chang

(57) ABSTRACT

An electrical assembly includes a metallic cage including a plurality of faces to commonly form a receiving space; a receptacle connector located in a rear portion of the receiving space; and a heat sink member mounted on an outer side of the metallic cage. The heat sink member comprising a first portion located on one of the faces, and a second portion located on another one of the faces. The first portion and the second portion are associated with the metallic cage by different mechanical structures. The first portion and the second portion are thermally connected with each other.

18 Claims, 37 Drawing Sheets

(51) Int. Cl.
*H05K 9/00* (2006.01)
*H01R 24/60* (2011.01)
*H01R 12/72* (2011.01)
*H01R 13/6581* (2011.01)
*H01R 13/6594* (2011.01)
*H01R 13/502* (2006.01)

(56) References Cited

U.S. PATENT DOCUMENTS

| | | | | |
|---|---|---|---|---|
| 9,547,140 | B2* | 1/2017 | Wu | G02B 6/4269 |
| 9,547,141 | B2* | 1/2017 | Wu | G02B 6/4269 |
| 9,668,378 | B2 | 5/2017 | Te | |
| 9,761,974 | B2 | 9/2017 | Molex | |
| 9,831,614 | B2* | 11/2017 | Khazen | G02B 6/4246 |
| 10,153,571 | B2* | 12/2018 | Kachlic | H01R 12/712 |
| 10,367,283 | B2* | 7/2019 | L'Esperance | G02B 6/4269 |
| 10,446,960 | B2* | 10/2019 | Guy Ritter | H05K 7/20436 |
| 10,455,739 | B2* | 10/2019 | Su | G02B 6/4269 |
| 2018/0368283 | A1* | 12/2018 | Little | H01R 13/518 |
| 2019/0115677 | A1* | 4/2019 | Kachlic | H01R 12/712 |
| 2019/0181582 | A1* | 6/2019 | Beltran | H01R 13/514 |
| 2019/0285817 | A1* | 9/2019 | Takai | G02B 6/4277 |
| 2019/0320552 | A1* | 10/2019 | Hsu | H01R 13/6594 |

* cited by examiner

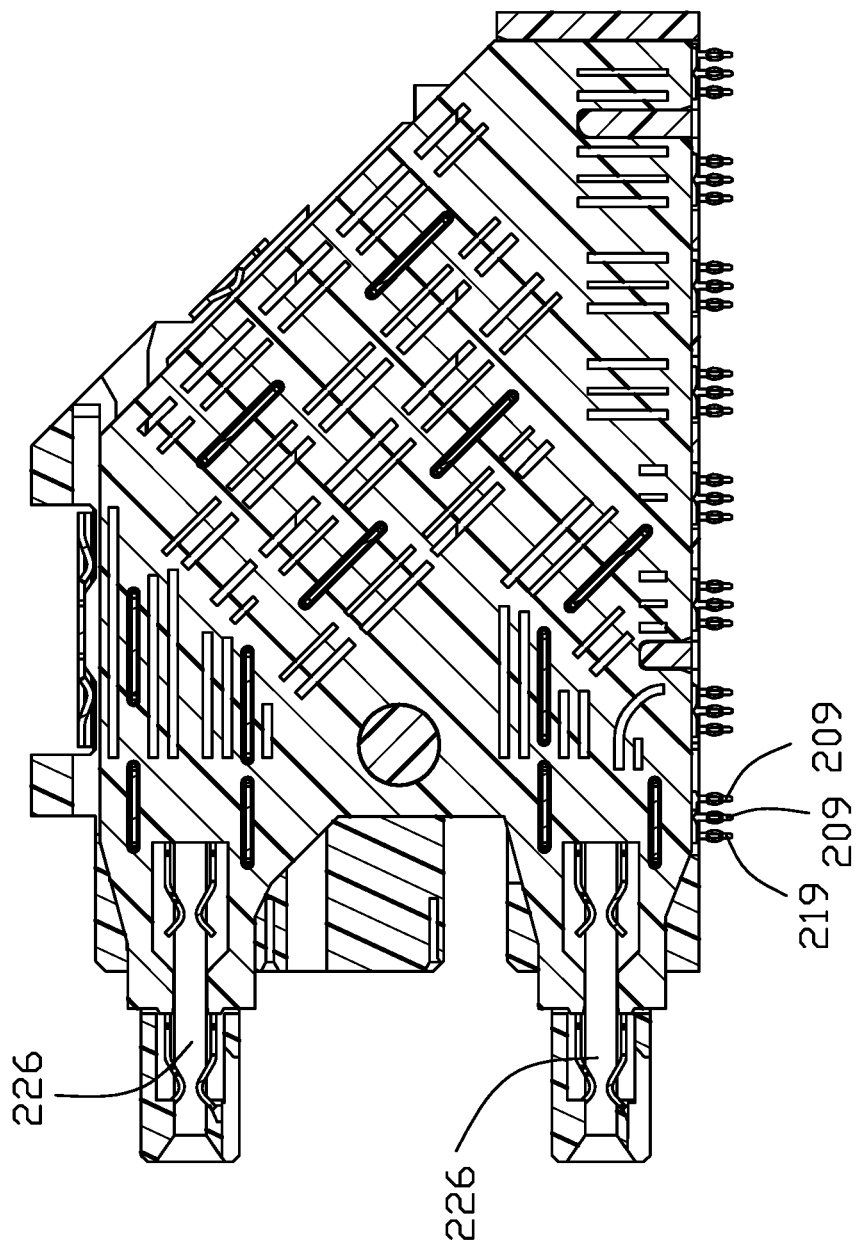

US 10,588,243 B2

ELECTRICAL CONNECTOR ASSEMBLY EQUIPPED WITH HEAT SINKS AND ADDITIONAL HEAT PIPE CONNECTED THEREBETWEEN

BACKGROUND OF THE INVENTION

1. Field of the Invention

The present invention relates to an electrical connector assembly, especially to the terminal layout and the terminal module assembly thereof and the so-called FP5 connector following, and related to an electrical connector assemblies, especially to the cage equipped with the L-shaped heat sink for heat transfer for both the upper plug module and the lower plug module in a unified manner instead of the discrete manner by following the spirit of the previous designs of which the provisional application has a Ser. No. 62/367,098 filed on Jul. 26, 2016 and another Ser. No. 62/399,272 filed on Sep. 23, 2016, 62/412,841 filed on Oct. 26, 2016, 62/425,627 filed on Nov. 23, 2016, 62/449,133 filed on Jan. 23, 2017, 62/509,141 filed on May 21, 2017, 62/522,113 filed Jun. 20, 2017, 62/533,131 filed on Jul. 17, 2017, 62/584,751 filed on Nov. 11, 2017, and 62/614,366 filed on Jan. 6, 2018.

2. Description of Related Art

Currently QSFP-DD Specification Rev. 0.1 discloses a 1×1 QSFP-DD module has eight electrical lanes. Each of the eight electrical lanes of the QSFP runs at the rate of 25 Gbit/s or 50 Gbit/s, thereby the QSFP-DD module support 200 Gbit/s or 400 Gbit/s Ethernet applications of. The QSFP-DD module has an electrical receptacle. The electrical receptacle has an insulative housing and four rows of electrical terminals received in the insulative housing. Each of the electrical terminals has a soldering section. Two rows soldering sections of the two top rows of the electrical terminals are offset in a longitudinal direction from two rows soldering sections of the two bottom rows of the electrical terminals. It is noted that another design having the fine pitch of 0.5 mm having the similar interface with QSFP is also presented. The conventional QSFP-DD 2×1 cage is equipped with a top heat sink and a rear heat sink discrete and separate from each other, thus being odd and requiring laborious assembling.

Even though both aforementioned connector assemblies are equipped with the heat sink for removing heat, anyhow a better heat transfer with the additional heat sink thereof is desired. Therefore, a new arrangement for the QSFP connection with relatively easy manufacturability and superior heat dissipation effect is desired.

SUMMARY OF THE INVENTION

An object of the present invention is to provide an electrical connector assembly equipped with a heat sink member to promote superior heat transfer performance of the whole electrical connector assembly.

To achieve the above-mentioned object, an electrical assembly comprising a metallic cage including a plurality of faces to commonly form a receiving space; a receptacle connector located in a rear portion of the receiving space; and a heat sink member mounted on an outer side of the metallic cage, the hest sink member comprising a first portion located on one of the faces, and a second portion located on another one of the faces; wherein the first portion and the second portion are associated with the metallic cage by different mechanical structures, and the first portion and the second portion are thermally connected with each other.

Another object of the present invention is to provide a heat sink member having a promoted superior heat transfer performance.

To achieve the above-mentioned object, a heat sink member for being used with an electrical assembly having a cage with a plurality of faces thereof, comprising a first portion for being located on an outer side of one of the faces and associated with the cage by a mechanical structure; and a second portion for being located on an outer side of another one of the faces and associated with the cage by another mechanical structure; wherein the first portion and the second portion are thermally connected with each other.

Another object of the present invention is to provide an electrical connector assembly equipped with a heat sink member to promote superior heat transfer performance of the whole electrical connector assembly.

To achieve the above-mentioned object, an electrical assembly comprising a metallic cage including a top face, a pair of side faces and a rear face to commonly form a receiving space; a receptacle connector located in a rear portion of the receiving space; and a heat sink member defining an L-shaped configuration in a side view and including a first portion intimately covering the top face, a second portion intimately covering the rear face and a third portion joining the first portion and said second portion together, the first portion and the second portion associated with the metallic cage by different mechanical structures.

The feature of the invention includes that the first portion and the second portion are thermally connected with each other. Therefore, the heat transfer performance is promoted.

Other objects, advantages and novel features of the invention will become more apparent from the following detailed description when taken in conjunction with the accompanying drawings.

BRIEF DESCRIPTION OF THE DRAWINGS

FIG. 22 is a cross-sectional view of the receptacle connector of FIG. 18(A);

DETAILED DESCRIPTION OF THE PREFERRED EMBODIMENT

Figure 1:
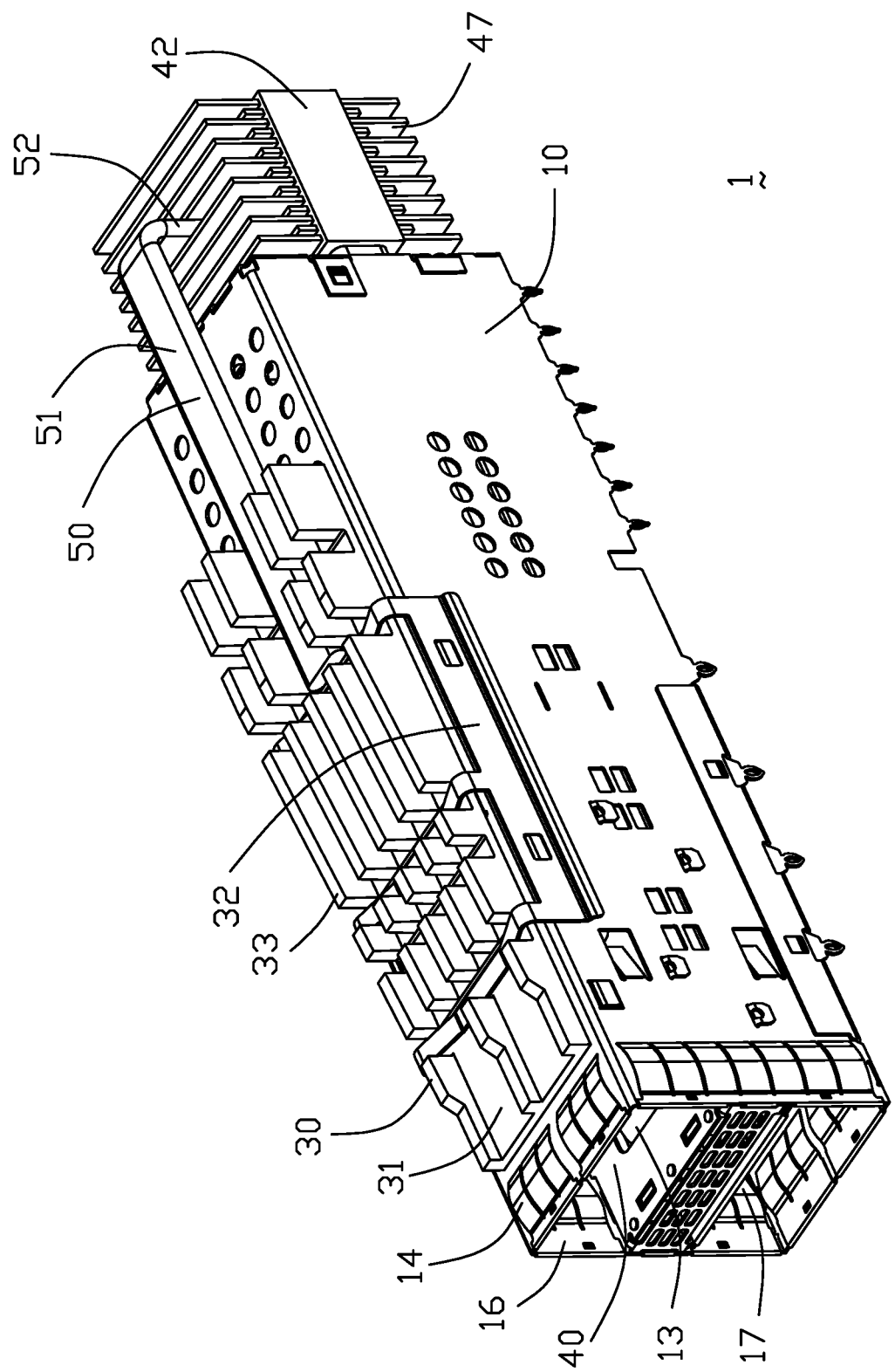
FIG. 1 is a perspective view of an electrical connector assembly according to a first embodiment of the present invention including a receptacle connector enclosed within a cage wherein the cage is equipped with the top heat sink unit and the rear heat sink unit with an intermediate heat pipe connected therebetween.
Figure 2:
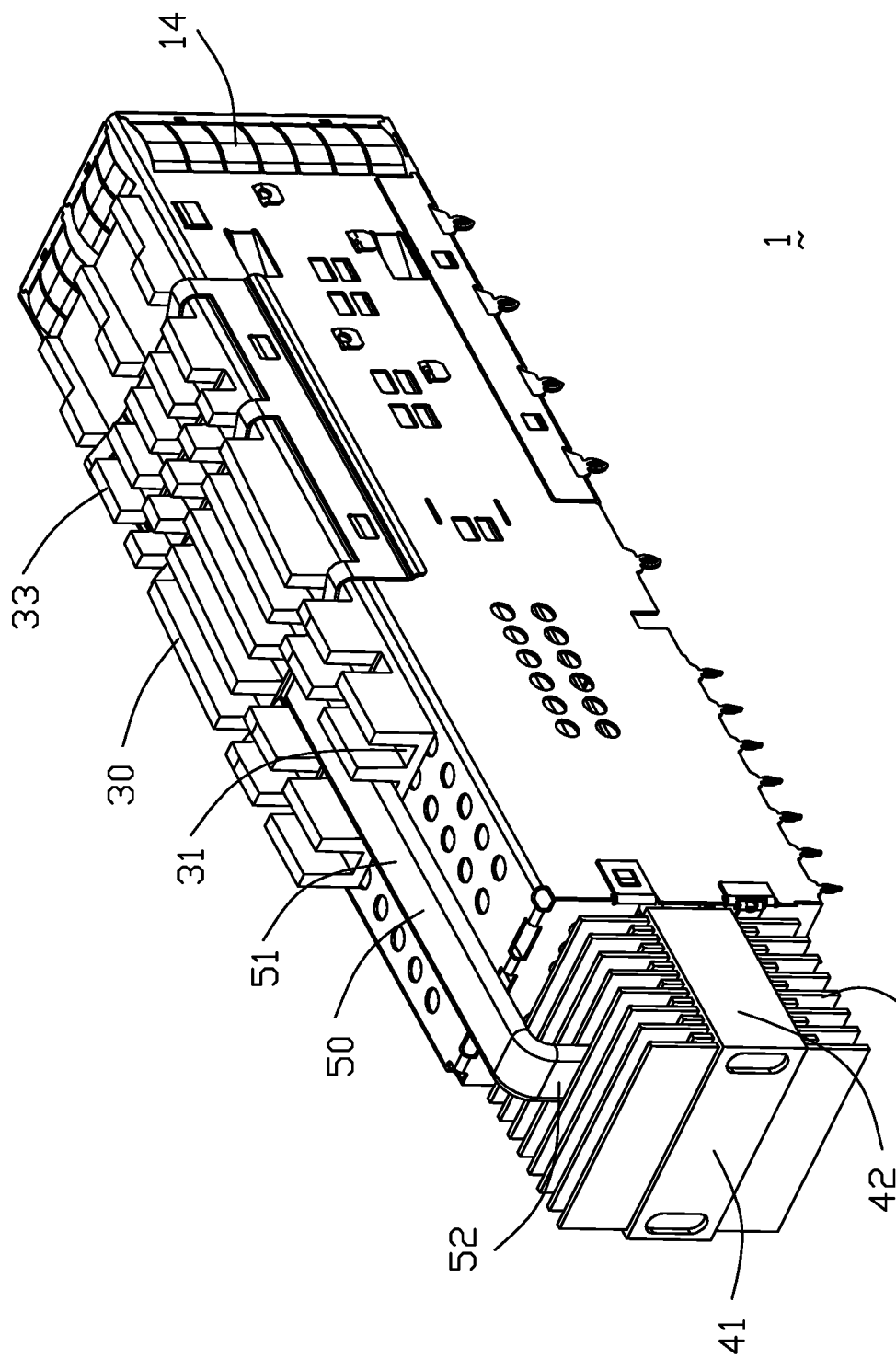
FIG. 2 is another perspective view of the electrical connector assembly of FIG. 1.
Figure 3:
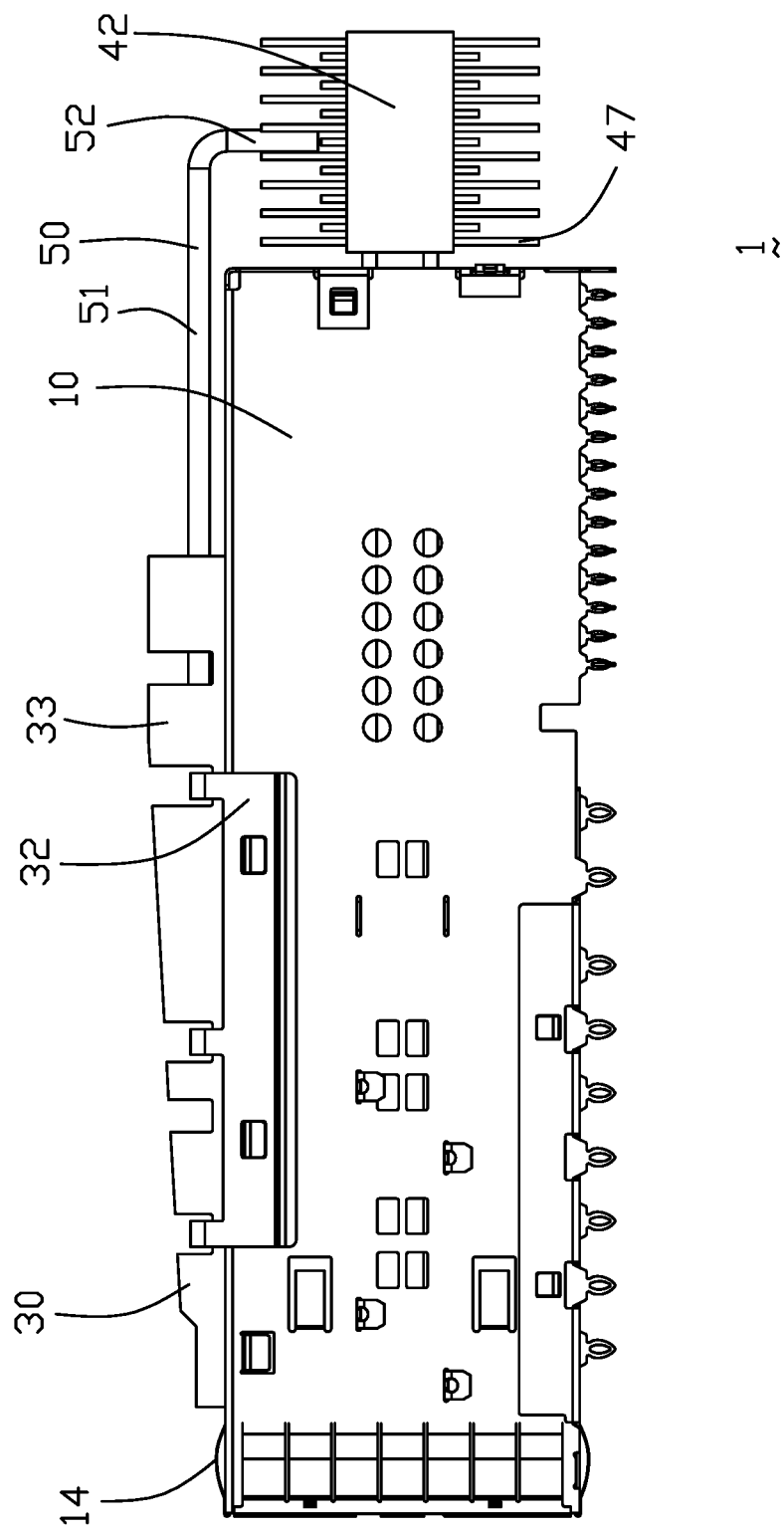
FIG. 3 is a side view of the electrical connector assembly of FIG. 1.
Figure 4:
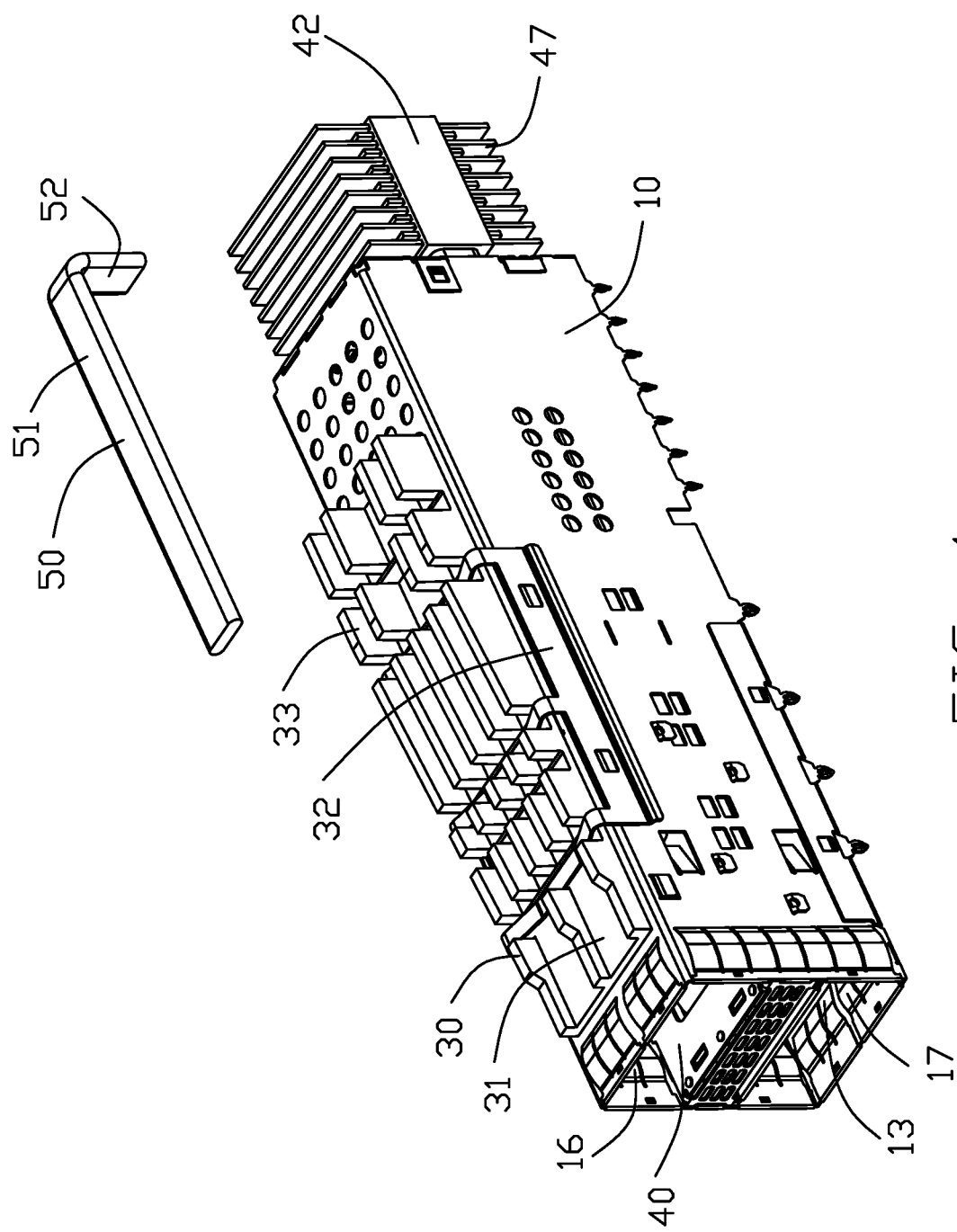
FIG. 4 is a perspective view of the electrical connector assembly of FIG. 1 wherein the intermediate heat pipe is moved away from the top heat sink unit and the rear heat sink unit.
Figure 5:
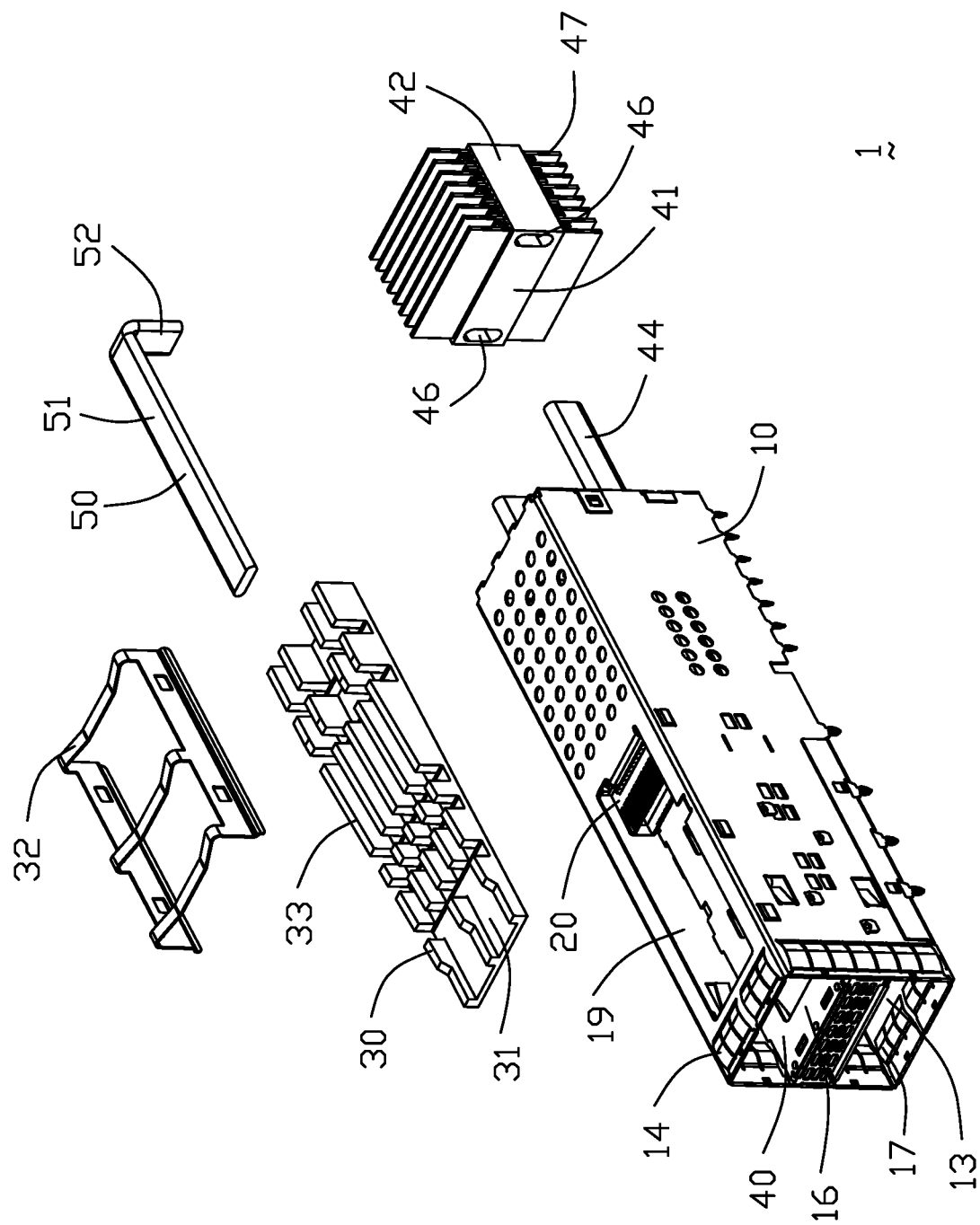
FIG. 5 is an exploded perspective view of the electrical connector assembly of FIG. 1.
Figure 6:
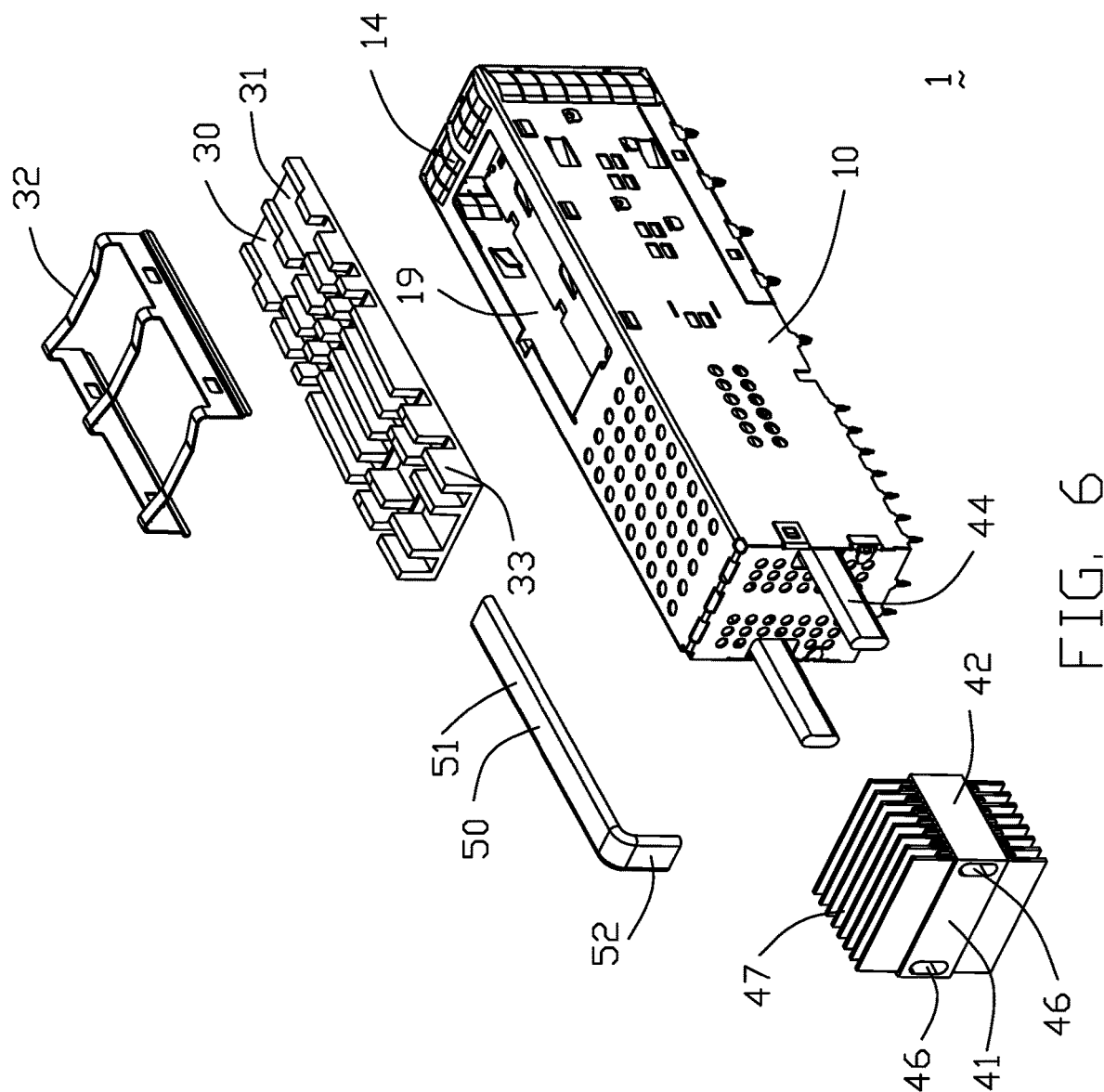
FIG. 6 is another exploded perspective view of the electrical connector assembly of FIG. 5.
Figure 7:
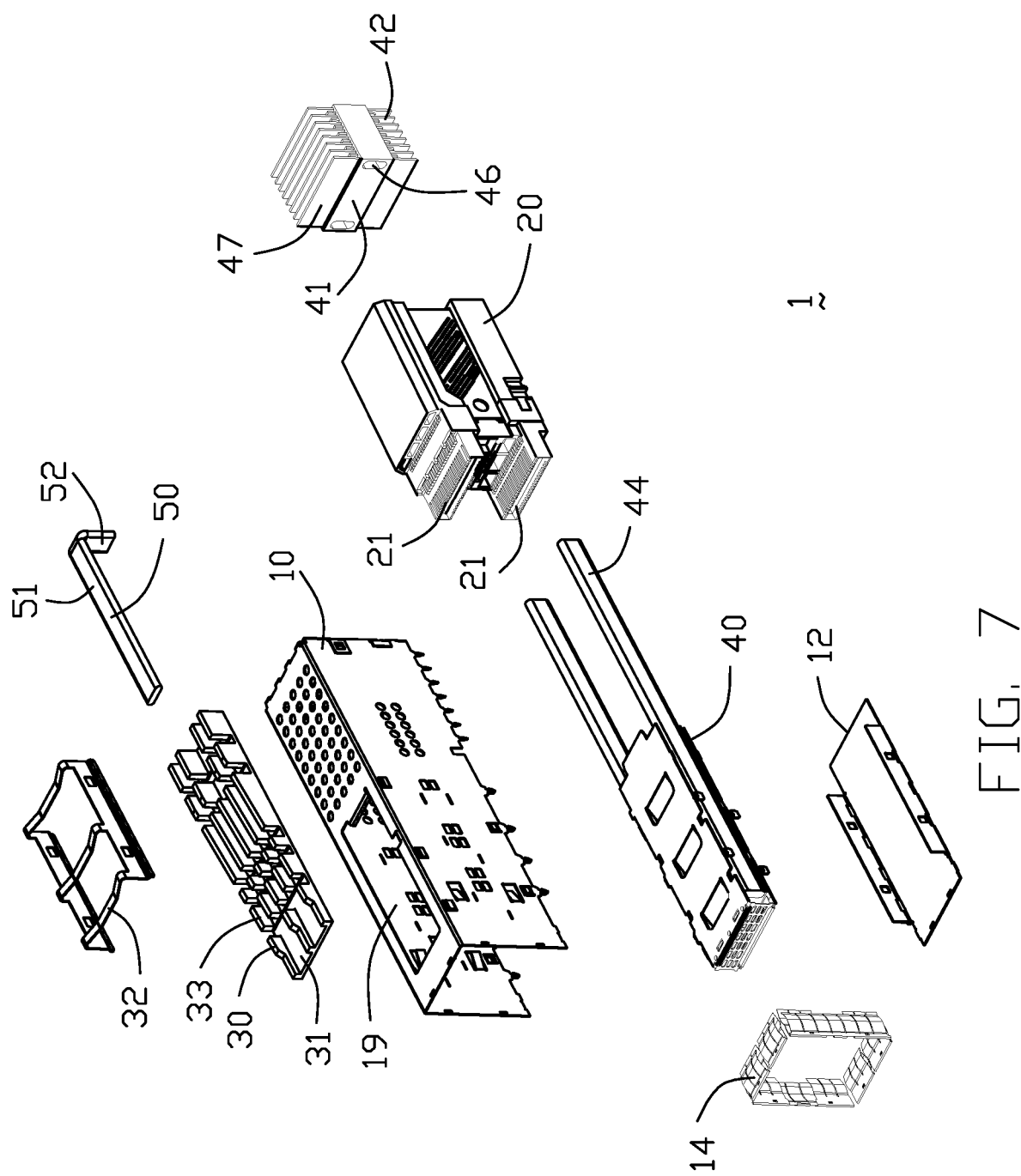
FIG. 7 is a further exploded perspective view of the electrical connector assembly of FIG. 5.
Figure 8:
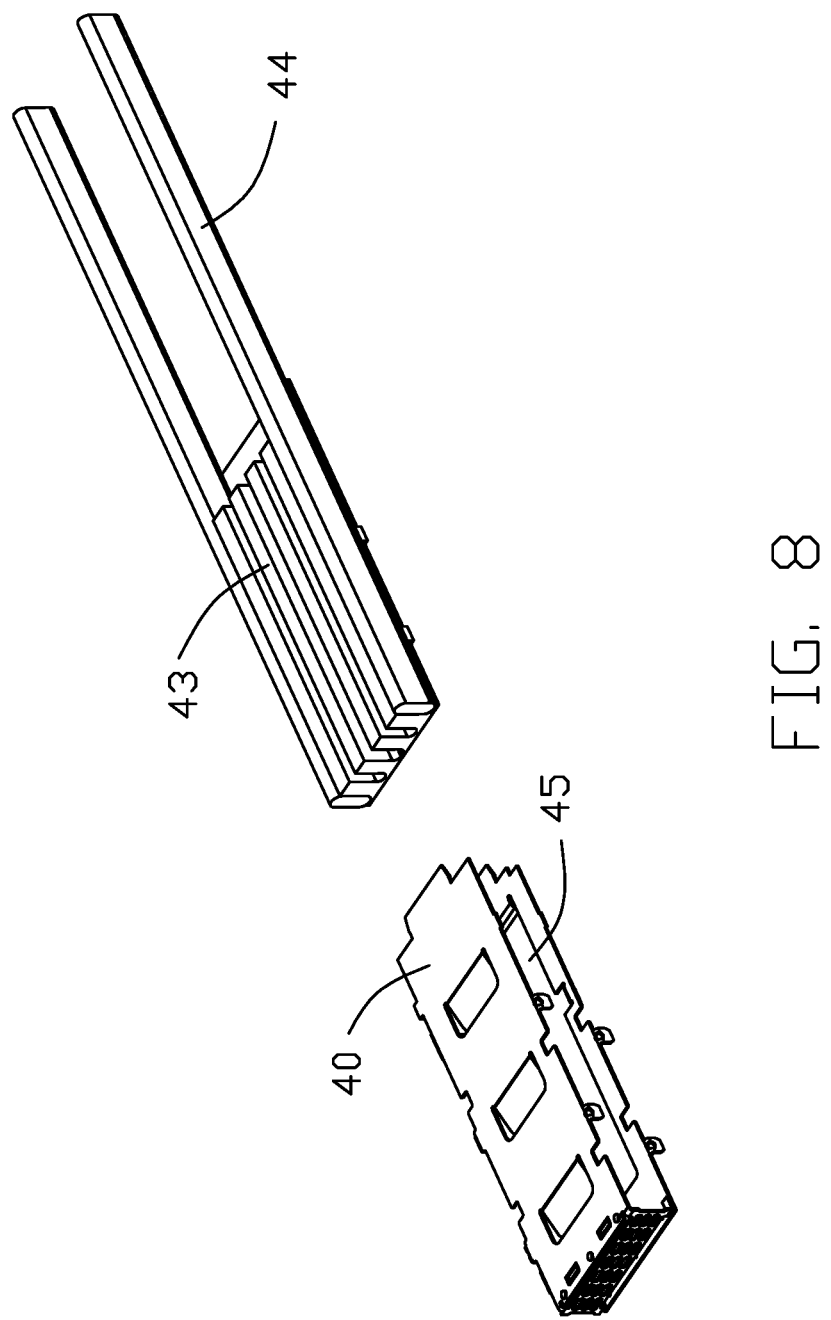
FIG. 8 is an exploded perspective view of the middle heat transfer unit of the electrical connector assembly of FIG. 7.
Figure 9:
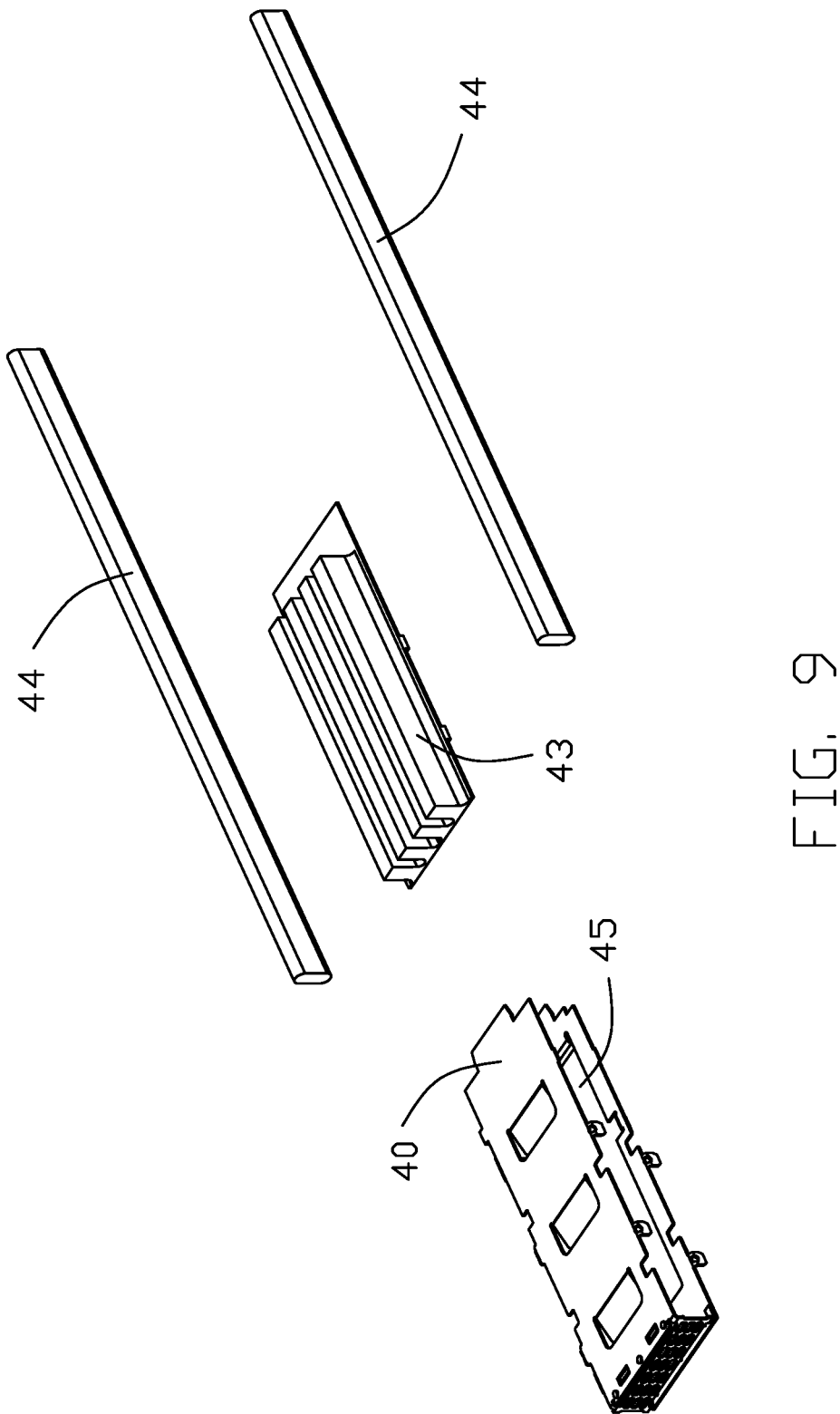
FIG. 9 is a further exploded perspective view of the middle heat transfer unit of the electrical connector assembly of FIG. 8.
Figure 10A:
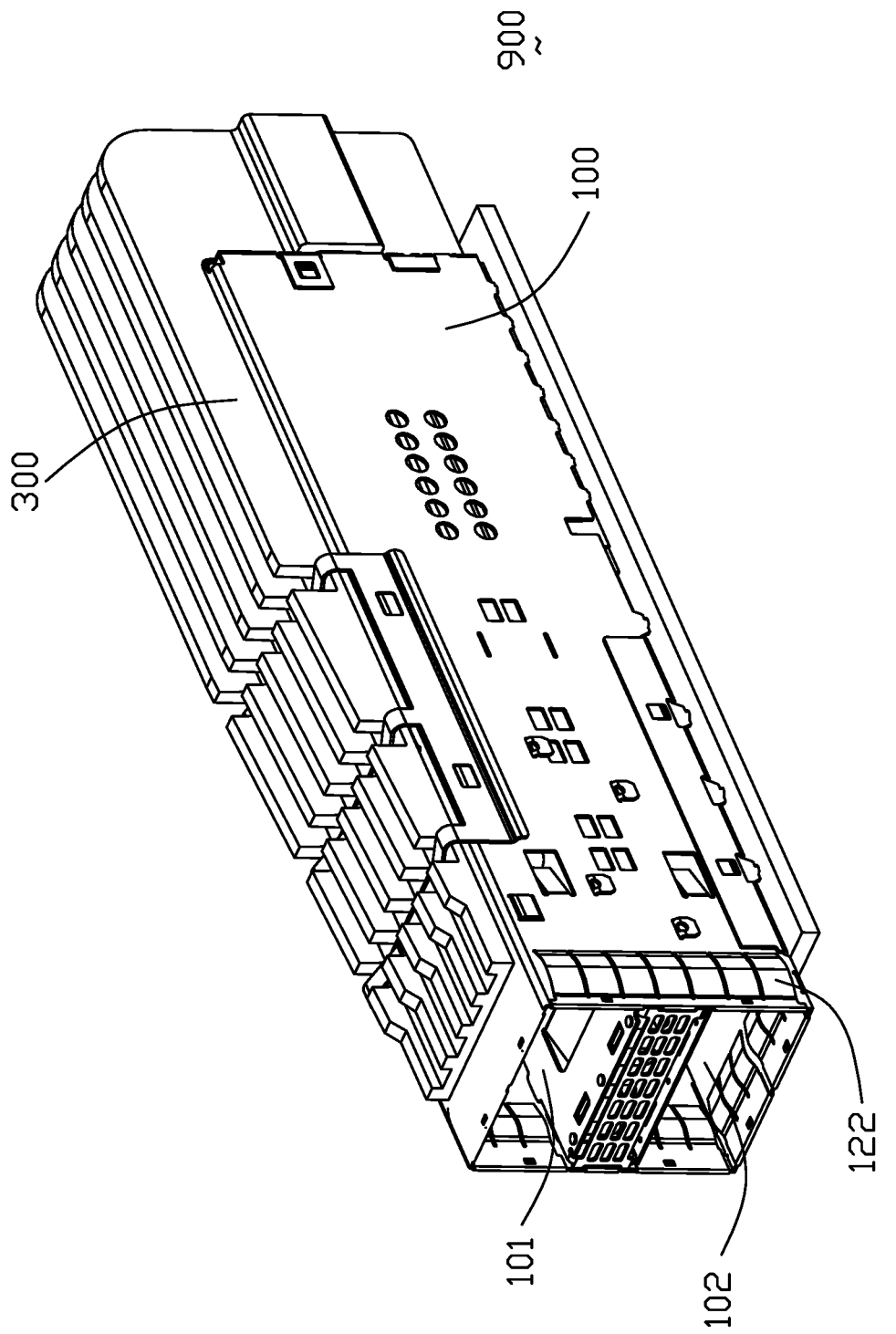
FIG. 10(A) is a perspective view of an electrical assembly according to a second embodiment of the present invention.
Figure 10B:
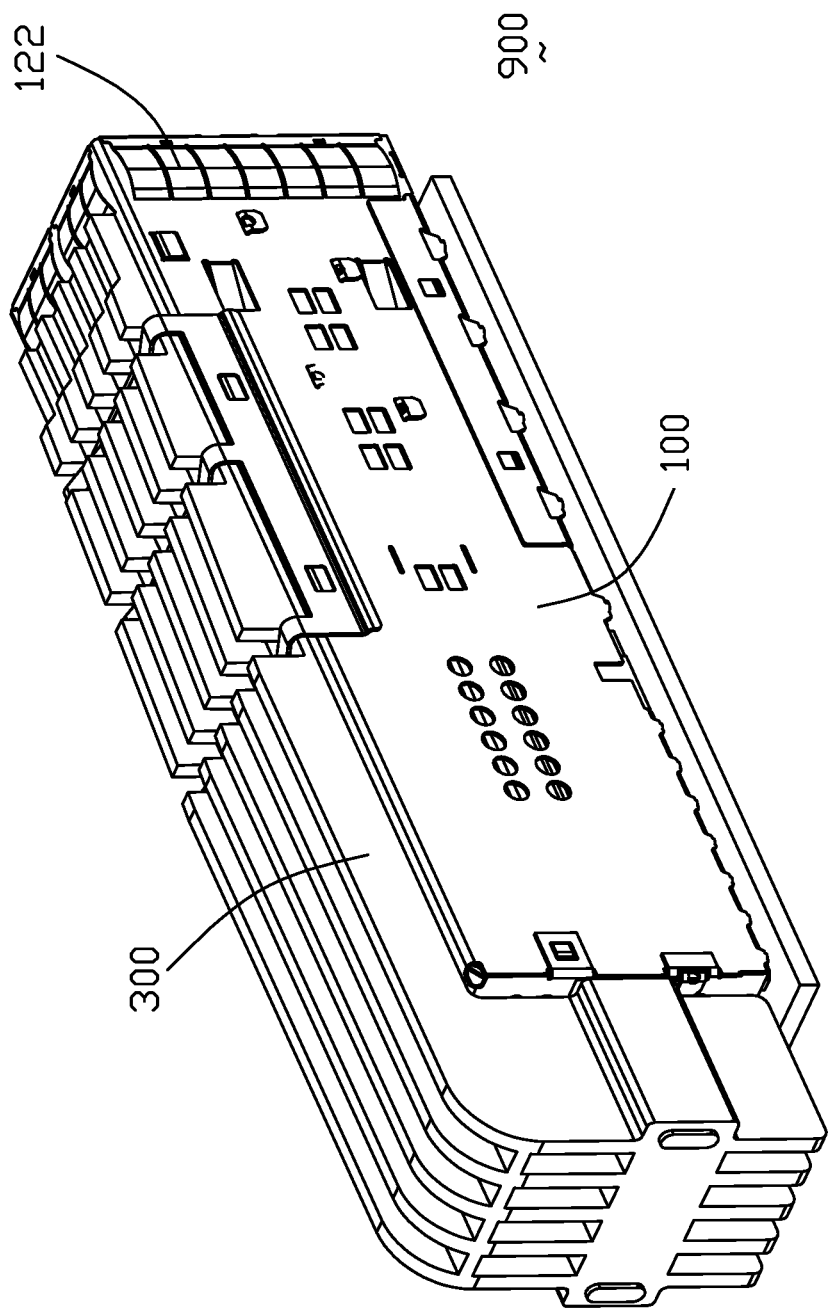
FIG. 10(B) is another perspective view of the electrical assembly of FIG. 10(A)
Figure 11A:
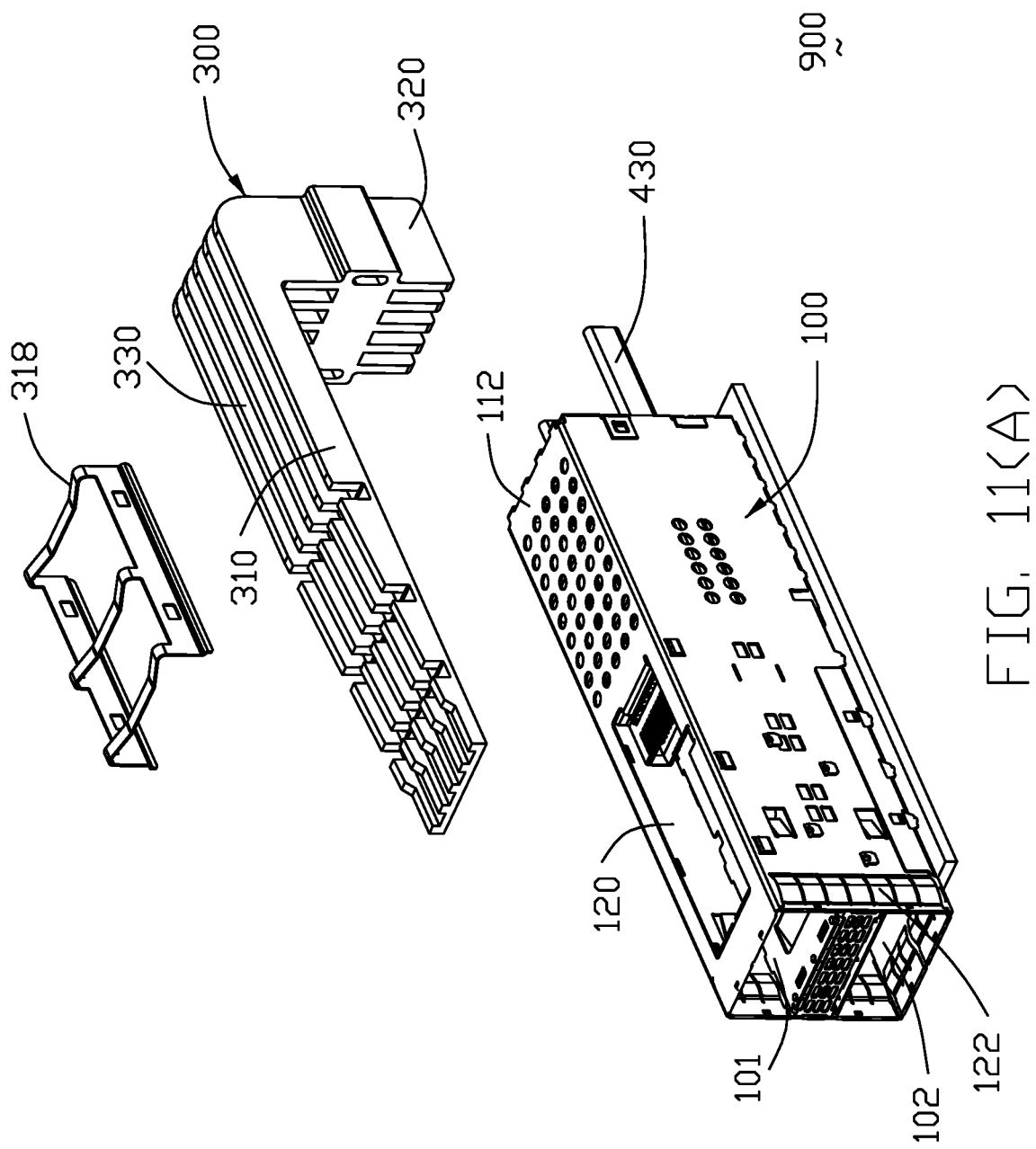
FIG. 11(A) is an exploded perspective view of the electrical assembly of FIG. 10(A)
Figure 11B:
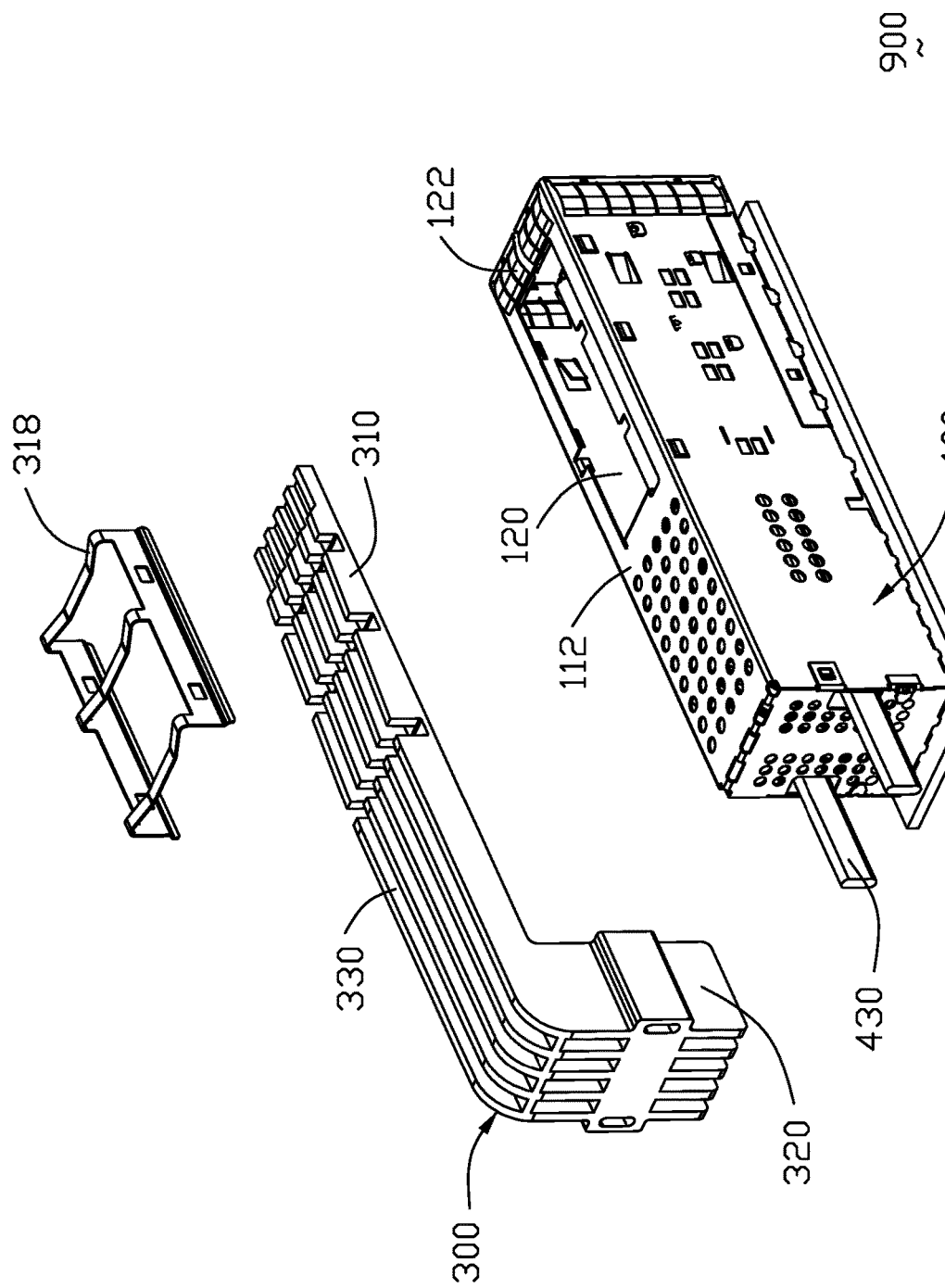
FIG. 11(B) is an exploded perspective view of the electrical assembly of FIG. 10(B)
Figure 12A:
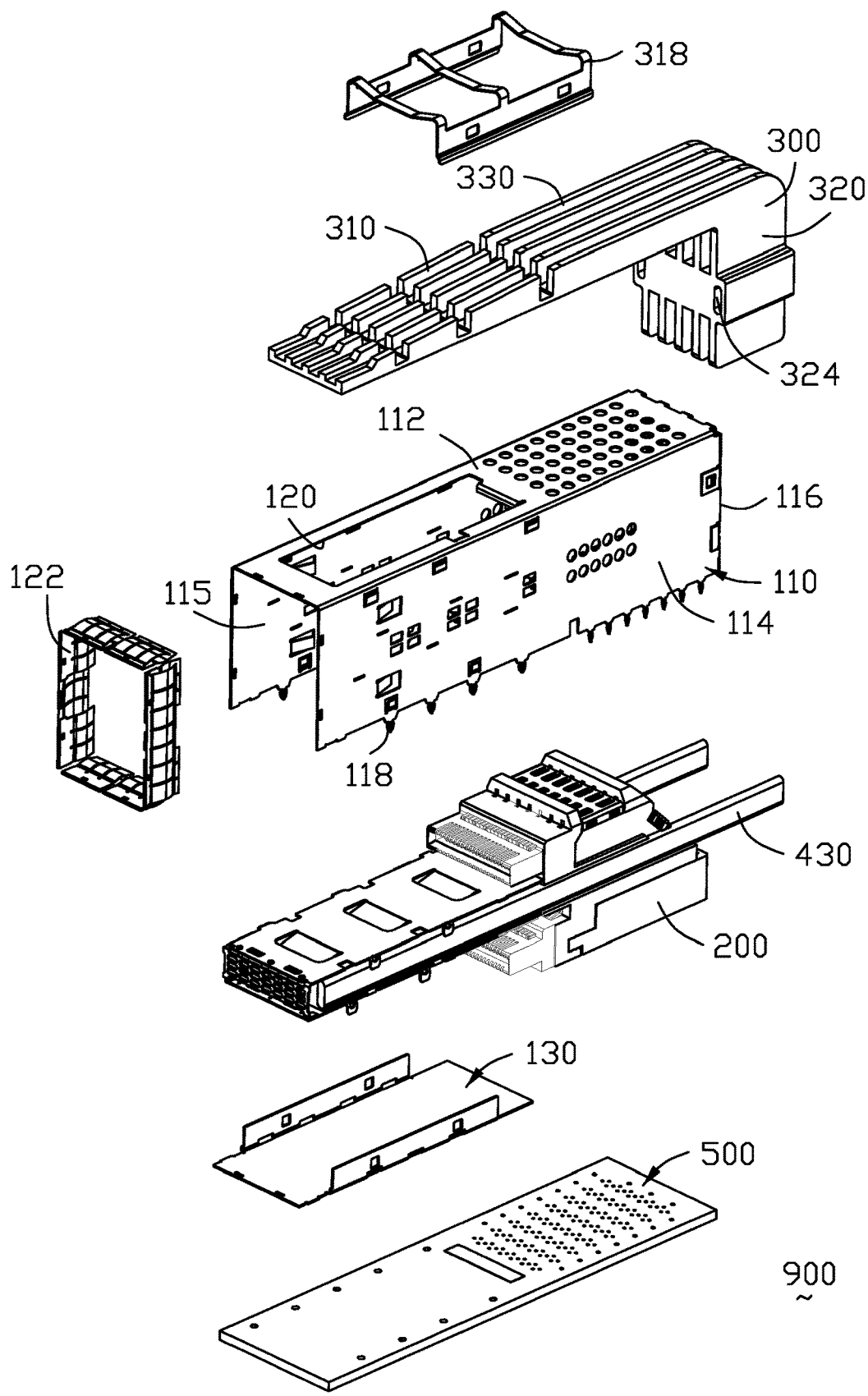
FIG. 12(A) is a further exploded perspective view of the electrical assembly of FIG. 11(A)
Figure 12B:
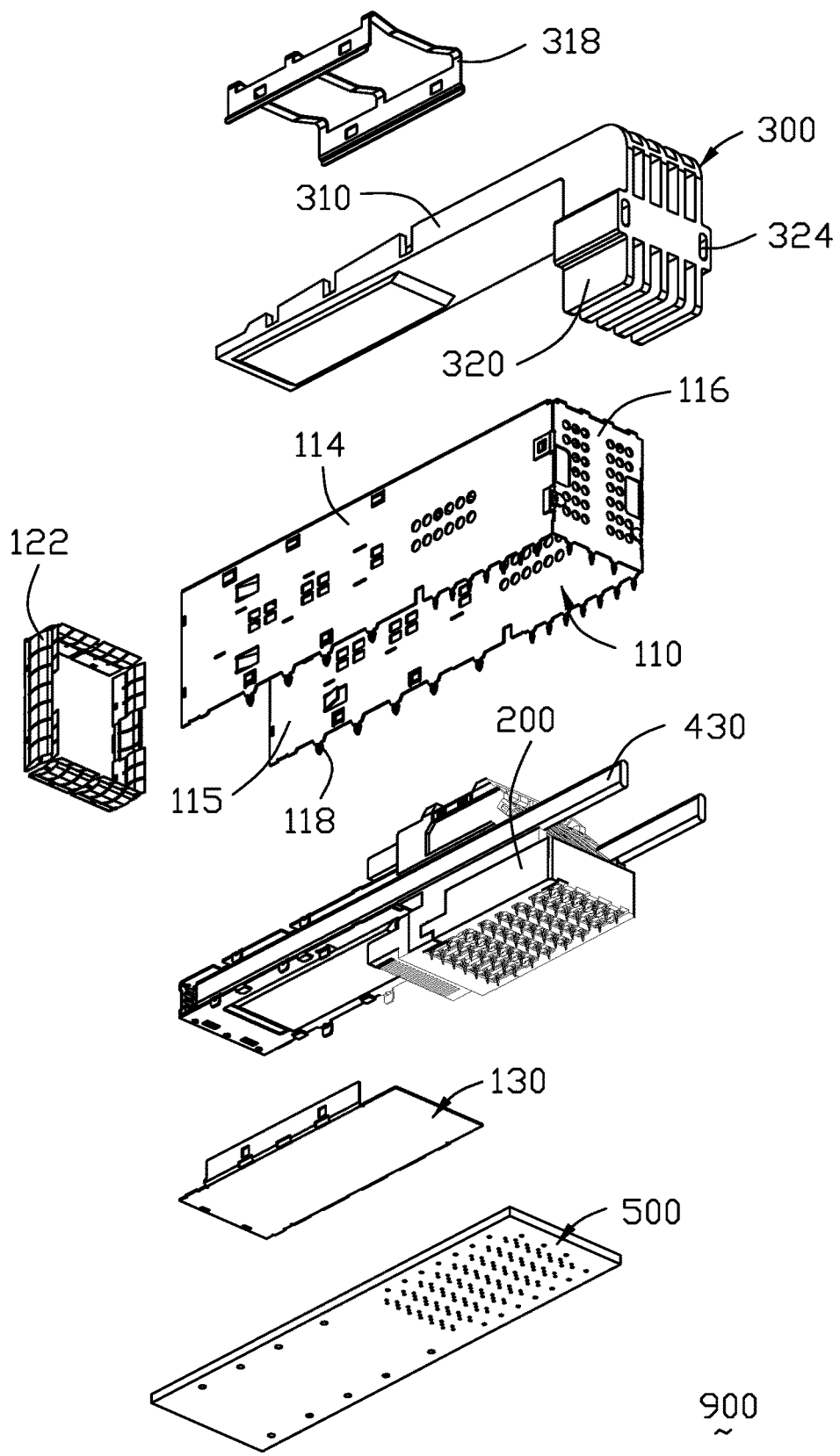
FIG. 12(B) is a further exploded perspective view of the electrical assembly of FIG. 11(B)
Figure 13A:
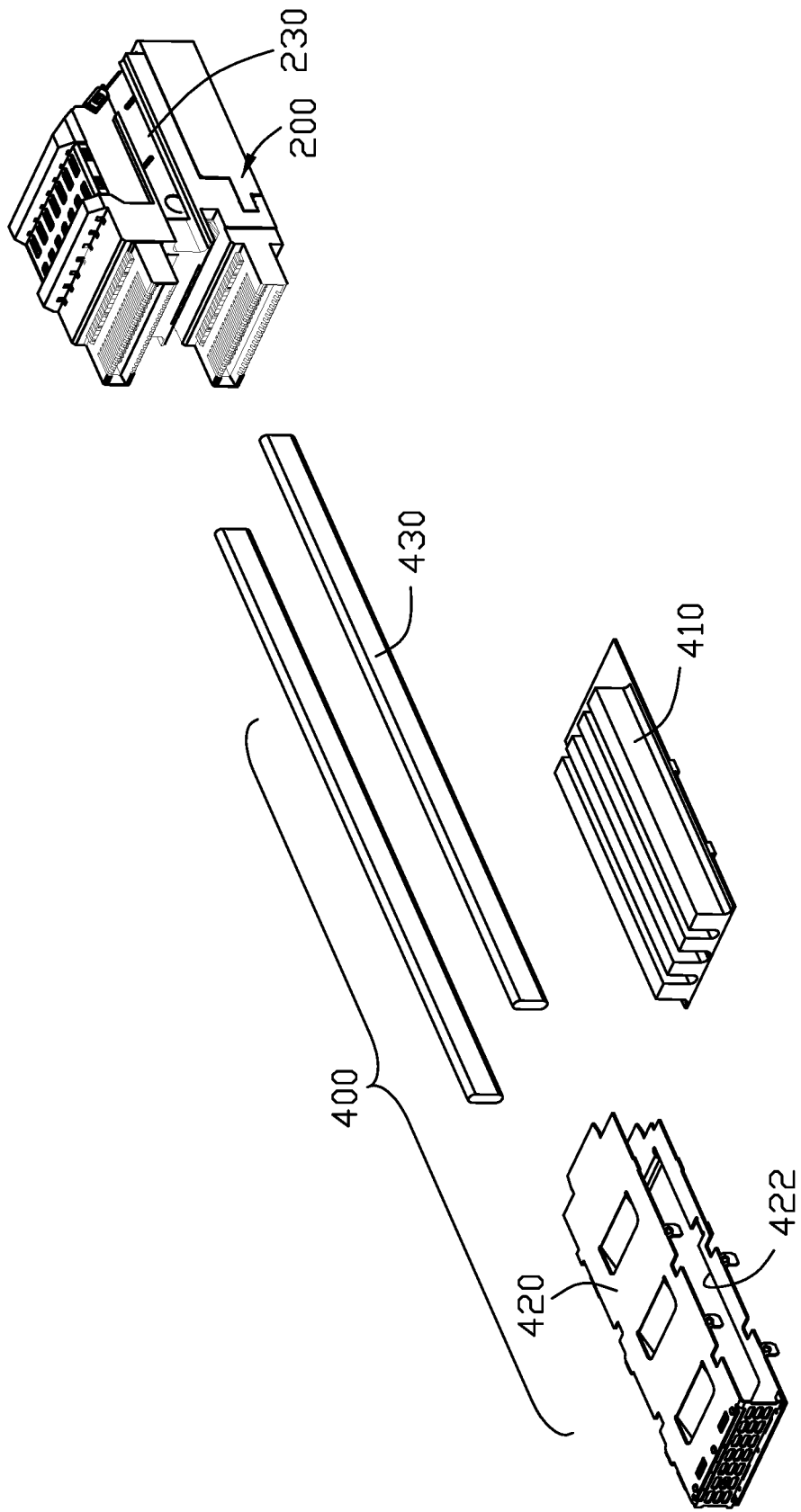
FIG. 13(A) is an exploded perspective view of the heat pipes and the associatively neighboring elements of FIG. 12(A)
Figure 13B:
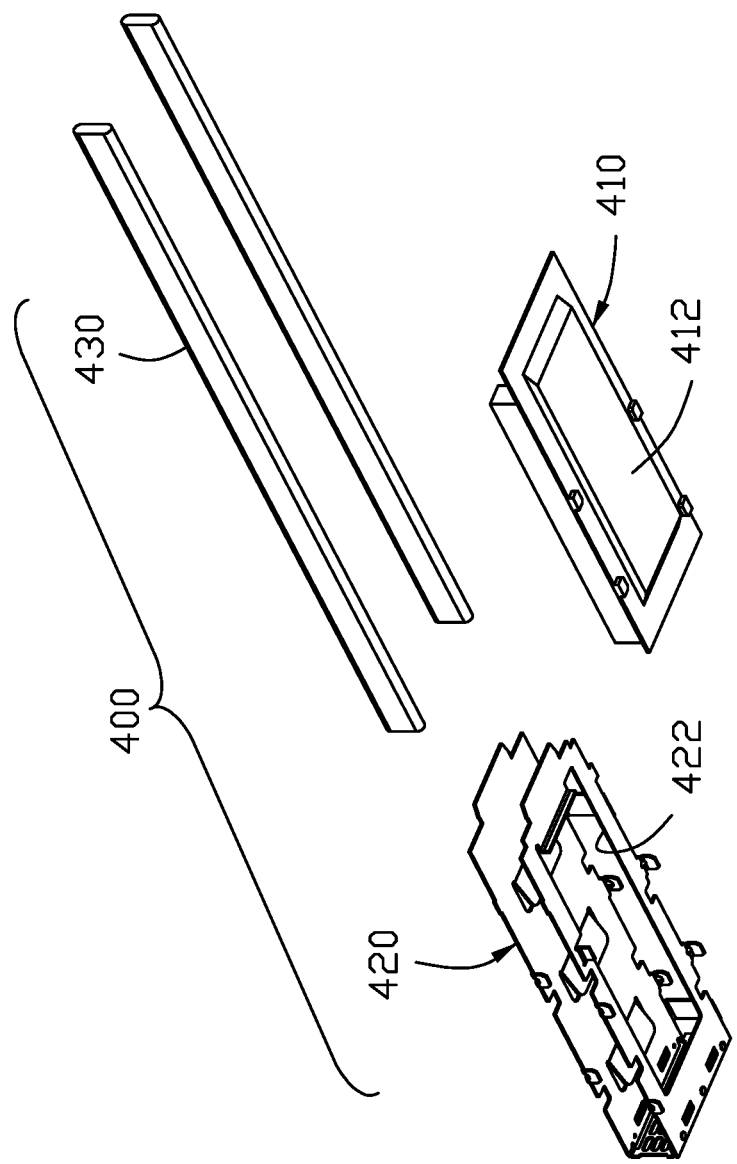
FIG. 13(B) is another exploded perspective view of the heat pipes and the associatively neighboring elements of FIG. 13(A)
Figure 14A:
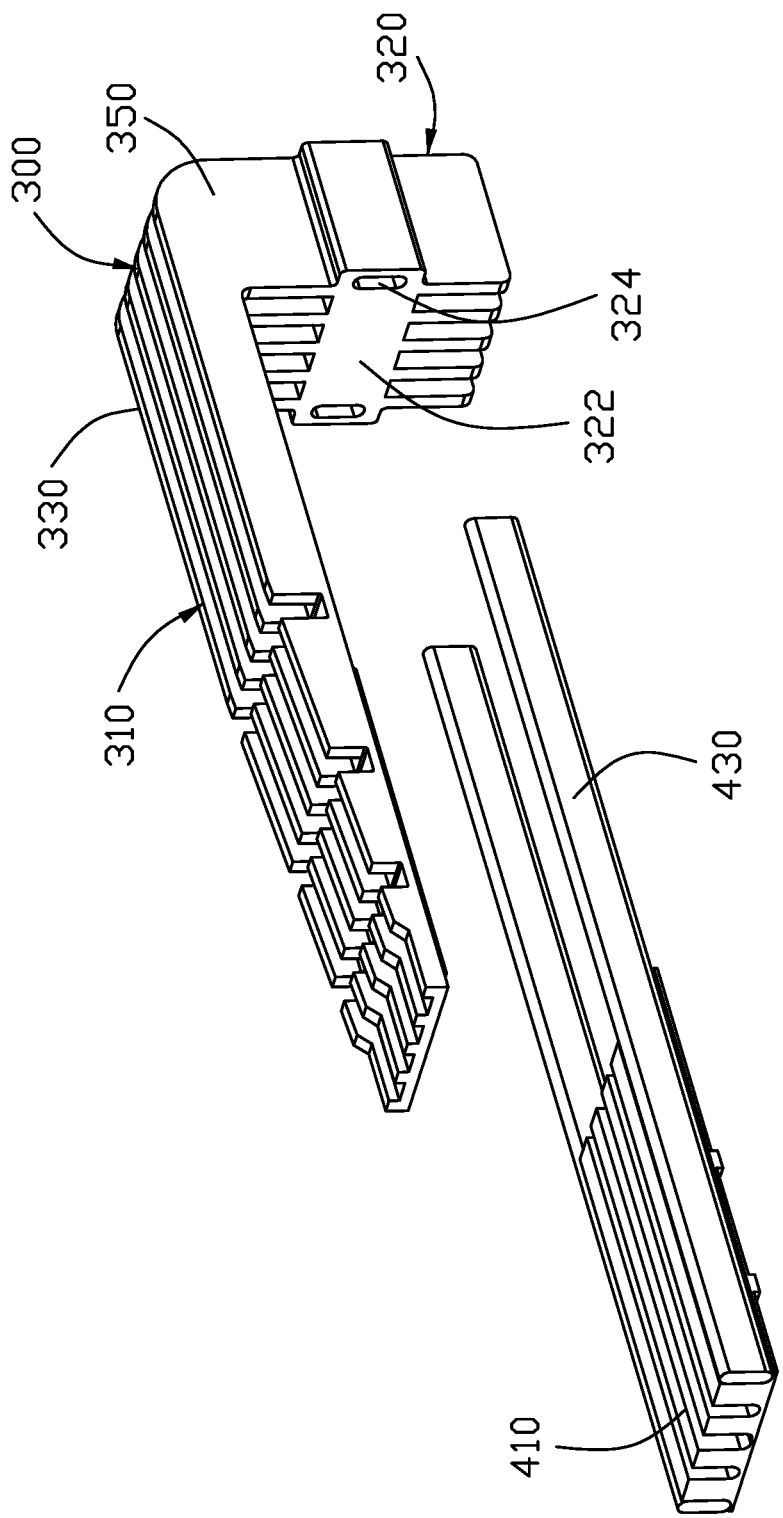
FIG. 14(A) is an exploded perspective view of a portion of the electrical assembly of FIG. 10(A) to show how the heat sink and the heat pipes work together.
Figure 14B:
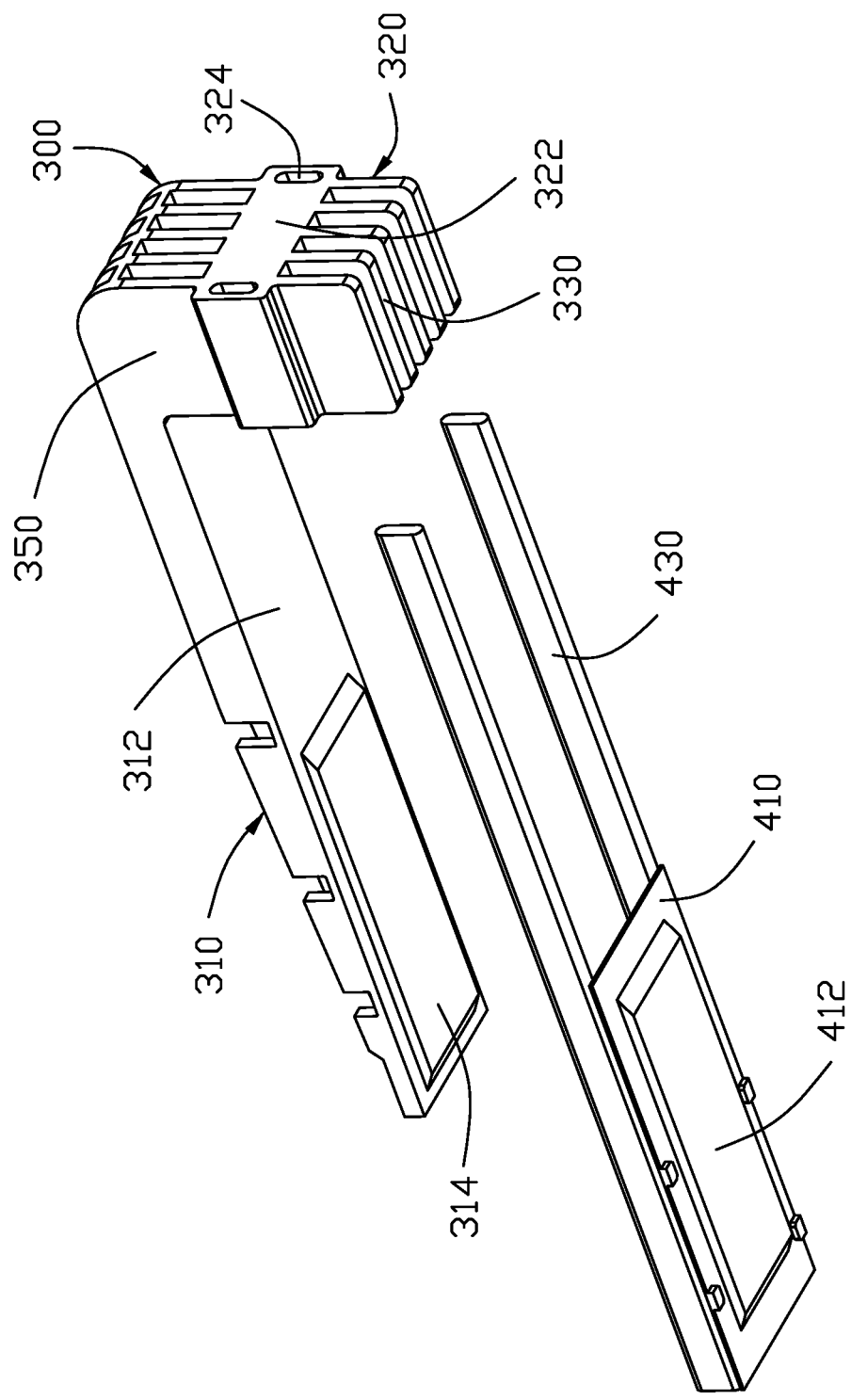
FIG. 14(B) is another exploded perspective view of the portion of the electrical assembly of FIG. 14(A) to show how the heat sink and the heat pipes work together.
Figure 15A:
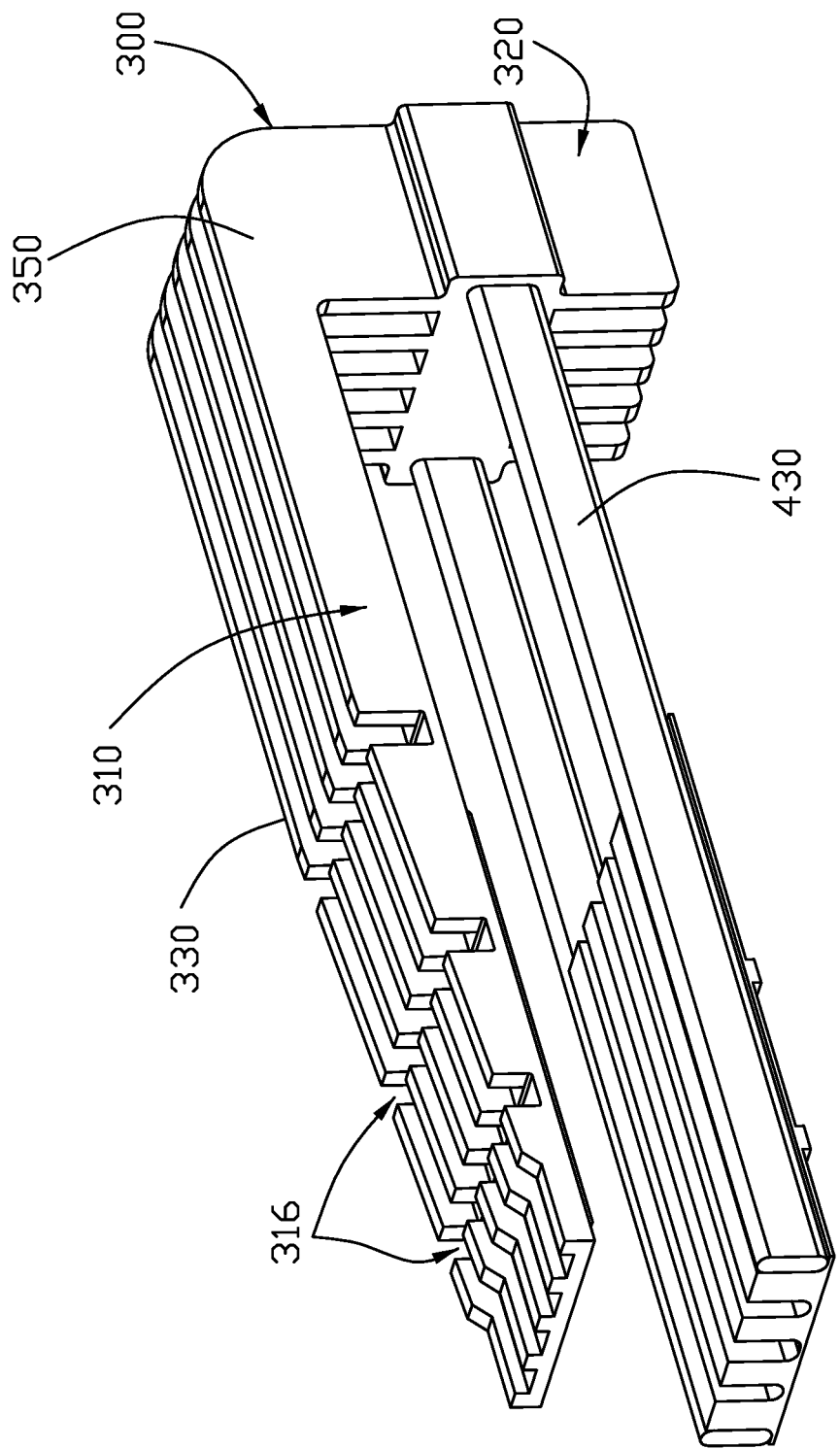
FIG. 15(A) is an assembled perspective view of the portion of the electrical assembly of FIG. 14(A) to show how the heat sink and the heat pipes work together.
Figure 15B:
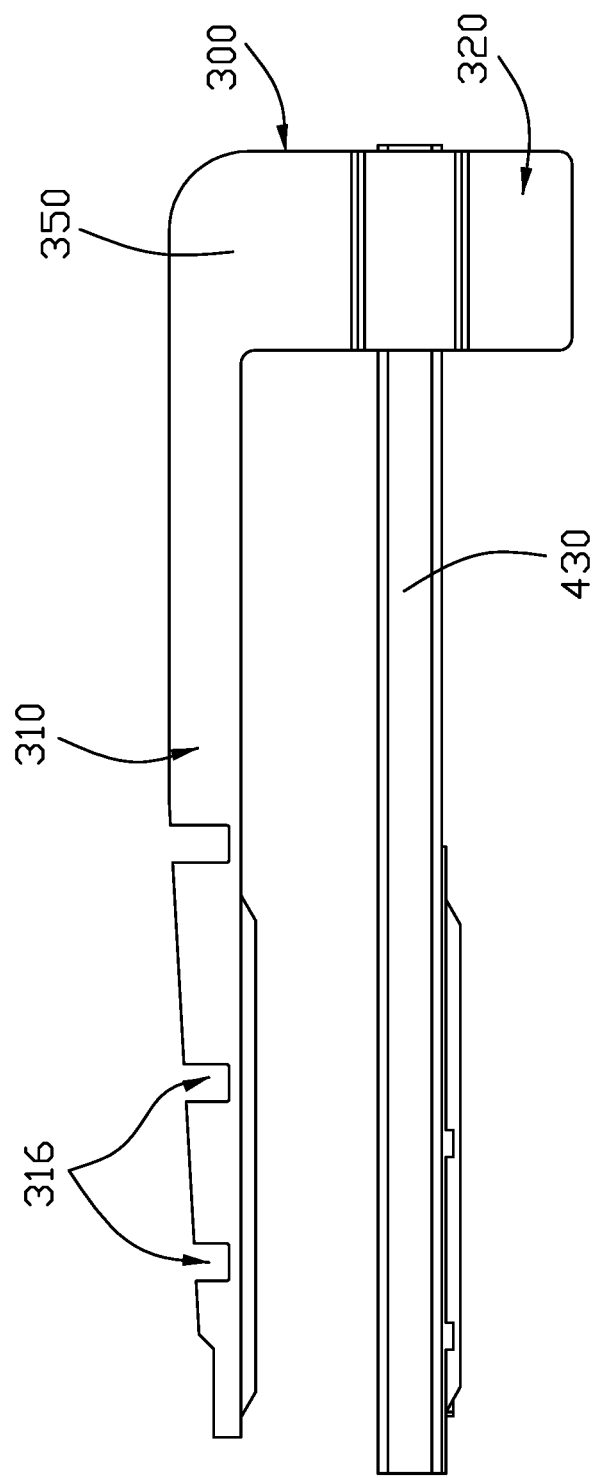
FIG. 15(B) is a side view of the portion of the electrical assembly of FIG. 15(A) to show how the heat sink and the heat pipes work together.
Figure 16:
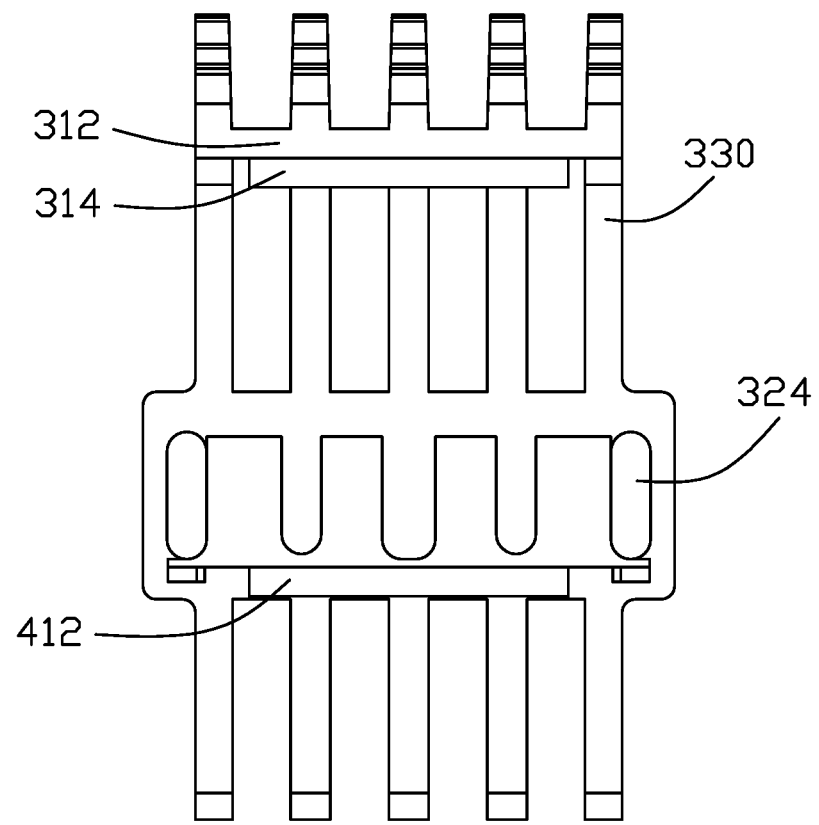
FIG. 16 is an elevational view of the heat sink of the electrical assembly of FIG. 10(A)
Figure 17A:
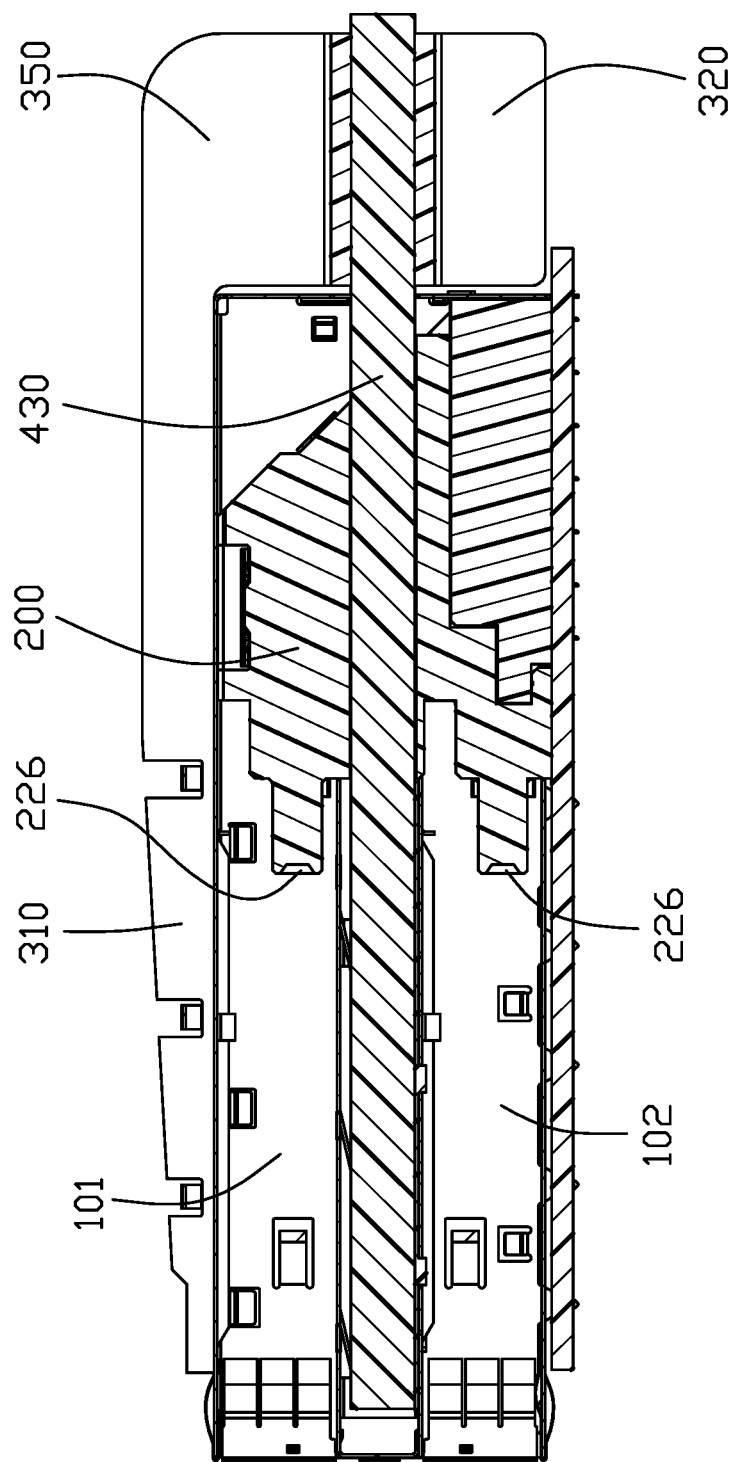
FIG. 17(A) is a cross-sectional view of the electrical assembly of FIG. 10(A) to show how the subassembly of the heat pipe and the heat sink works with regard to the remaining elements thereof.
Figure 17B:
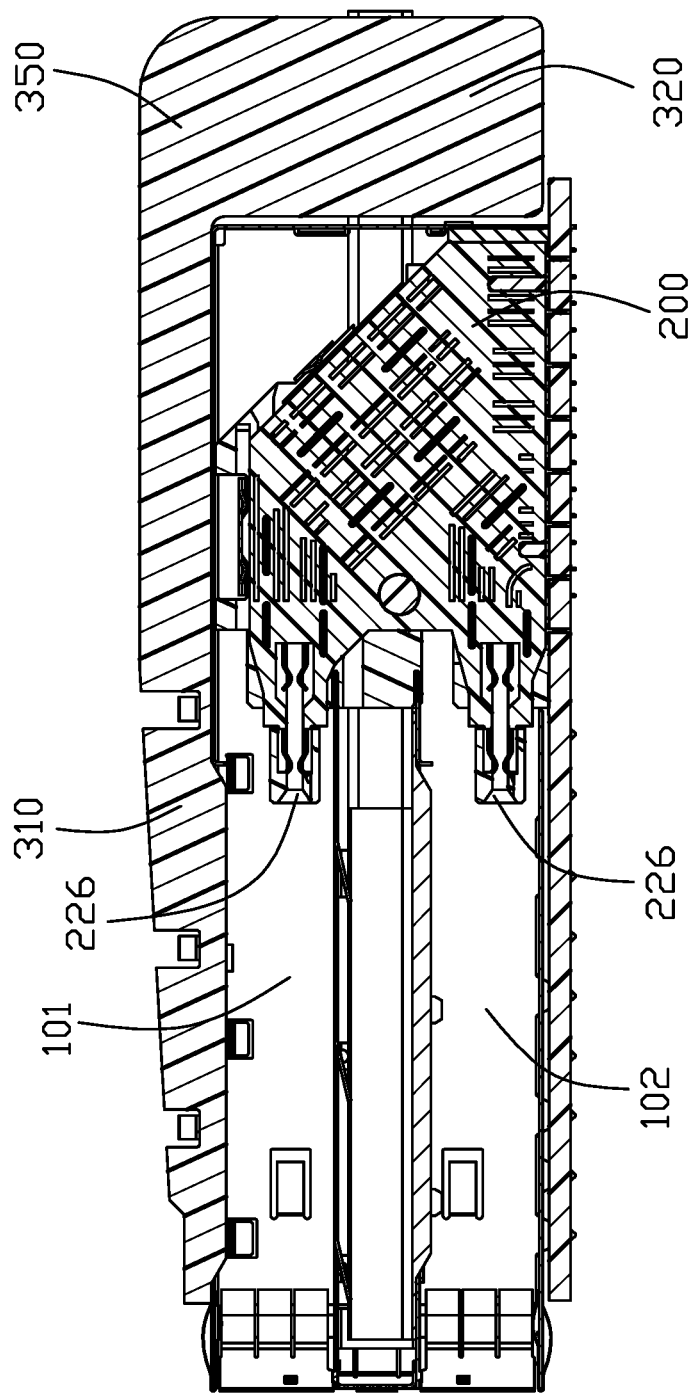
FIG. 17(B) is another cross-sectional view of the electrical connector of FIG. 10(A) to show how the contact module in the receptacle connector communicates with the two ports in the cage.
Figure 18A:
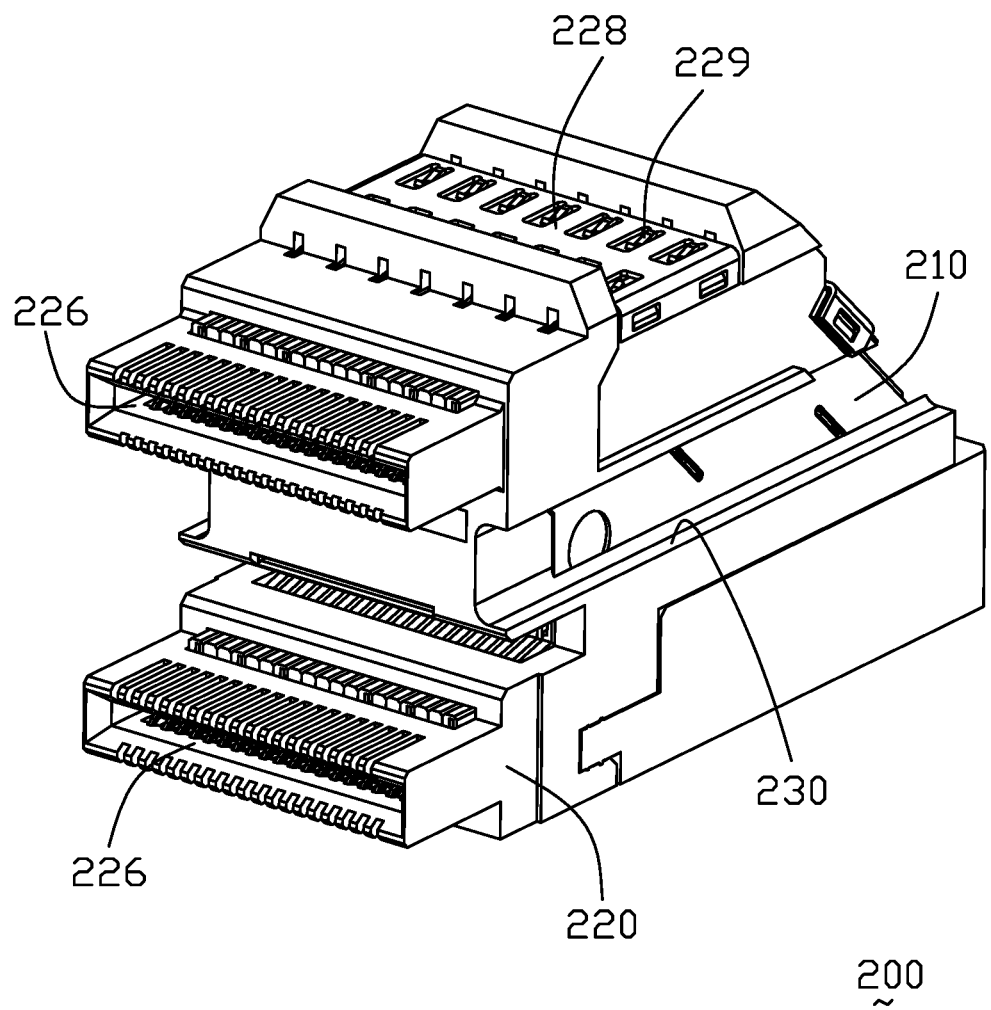
FIG. 18(A) is a perspective view of the receptacle connector of the electrical assembly of FIG. 10(A)
Figure 18B:
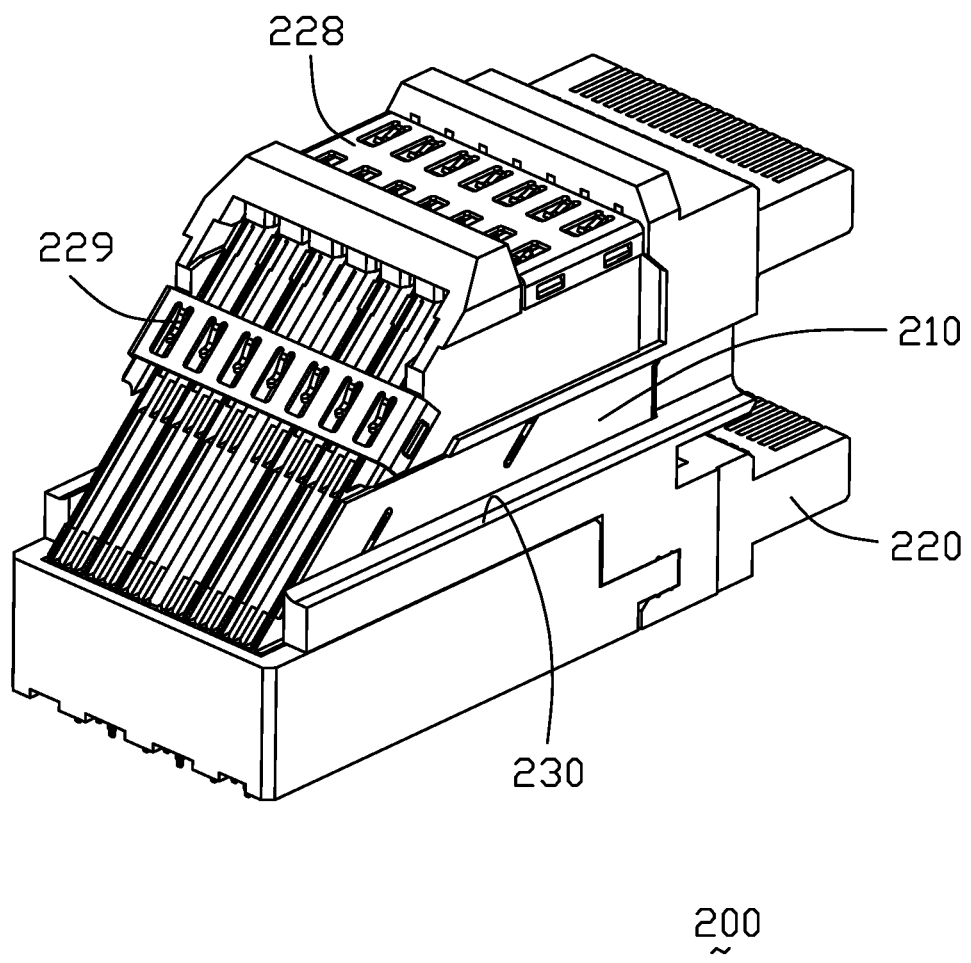
FIG. 18(B) is another perspective view of the receptacle connector of the electrical assembly of FIG. 18(A)
Figure 18C:
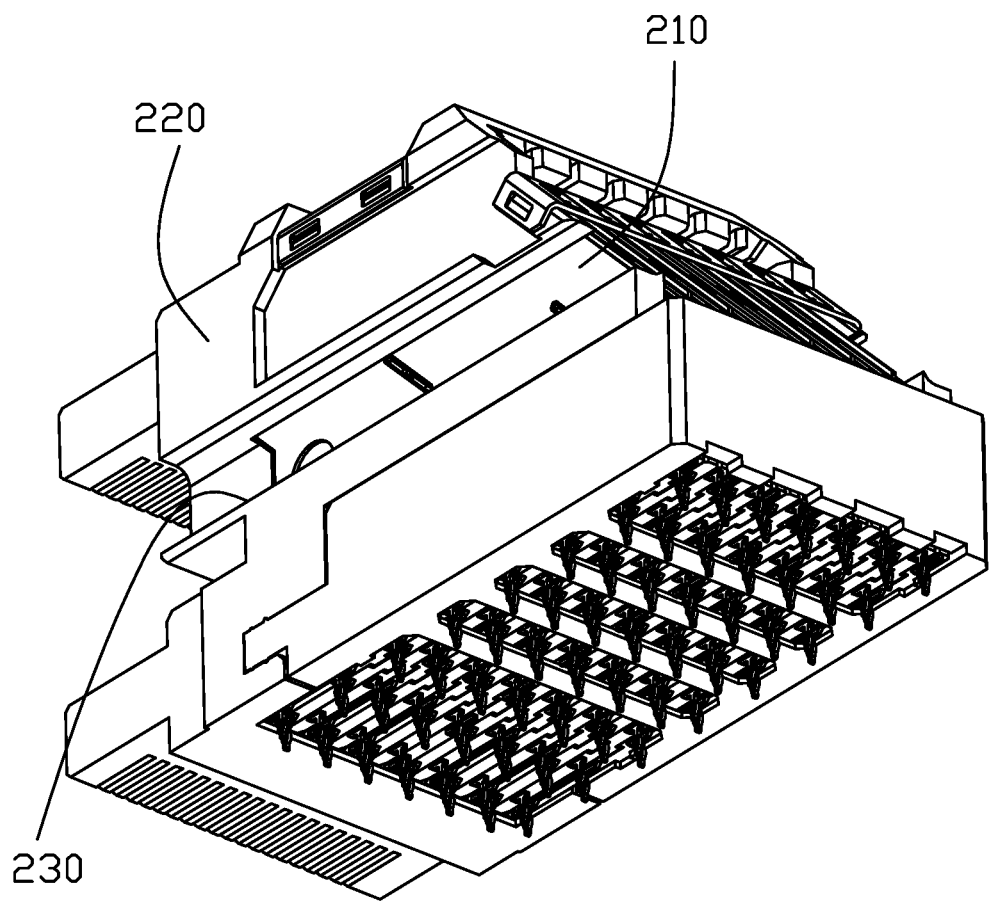
FIG. 18(C) is another perspective view of the receptacle connector of the electrical assembly of FIG. 18(A)
Figure 19A:
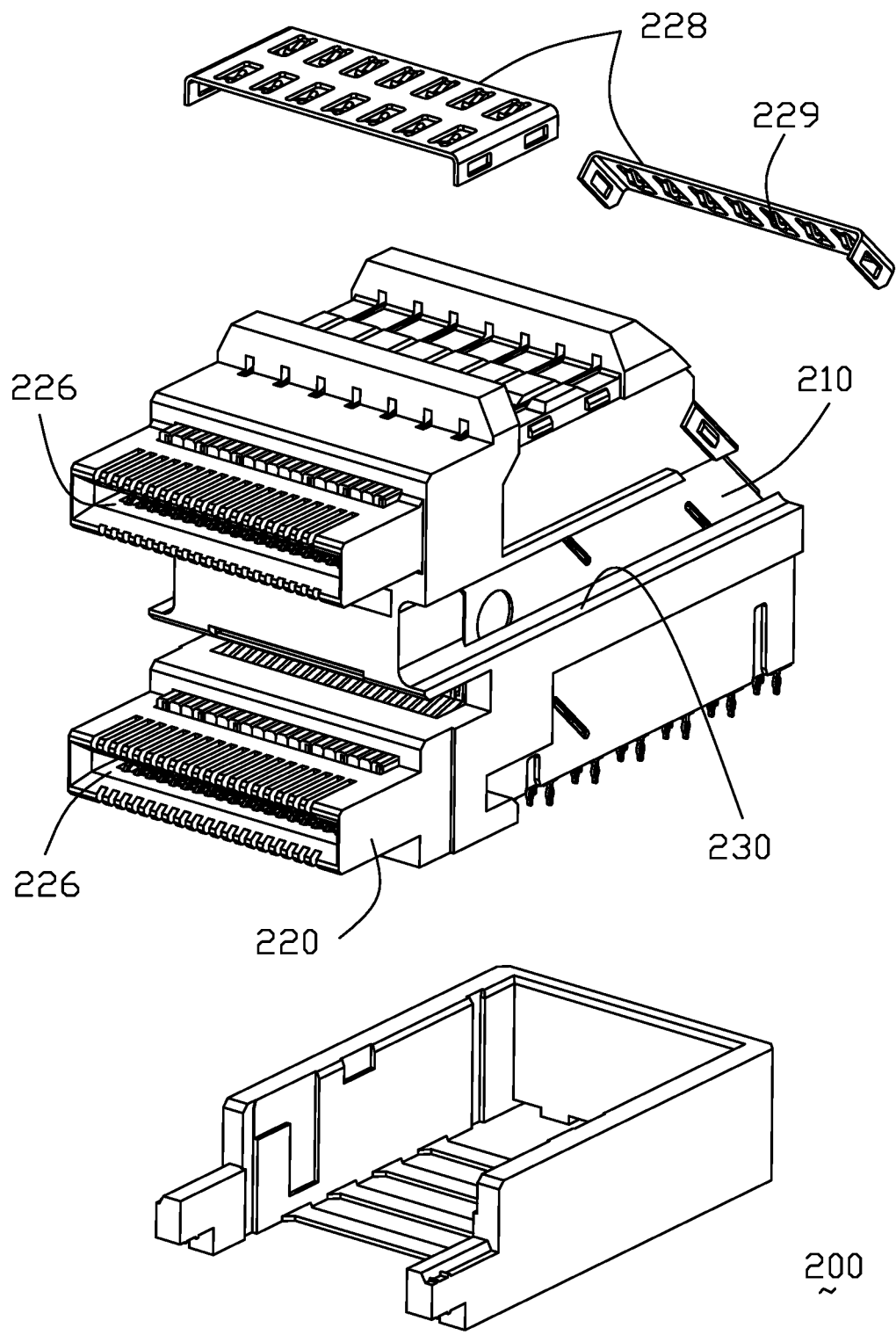
FIG. 19(A) is an exploded perspective view of the receptacle connector of the electrical assembly of FIG. 18(A)
Figure 19B:
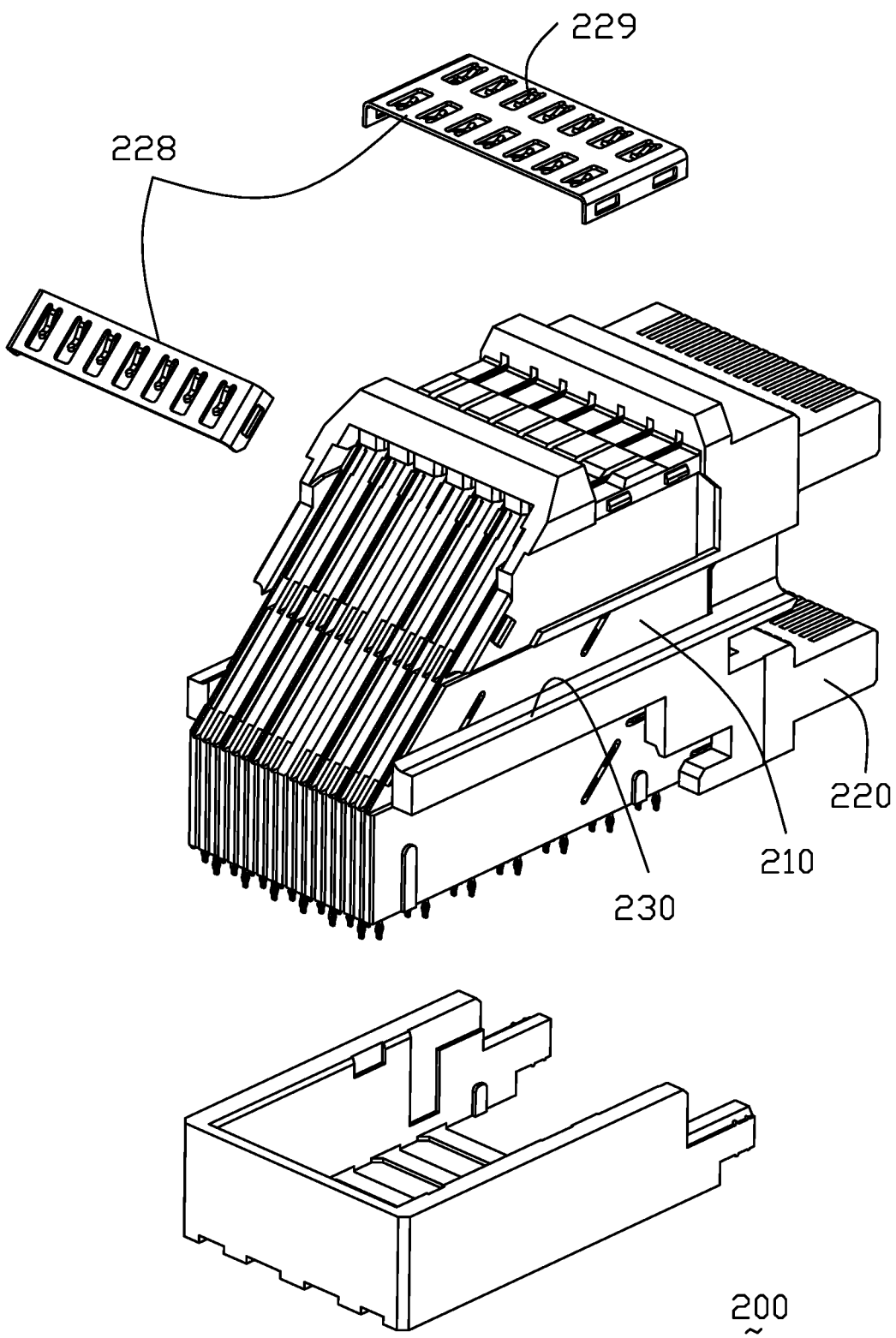
FIG. 19(B) is an exploded perspective view of the receptacle connector of the electrical assembly of FIG. 18(B)
Figure 20A:
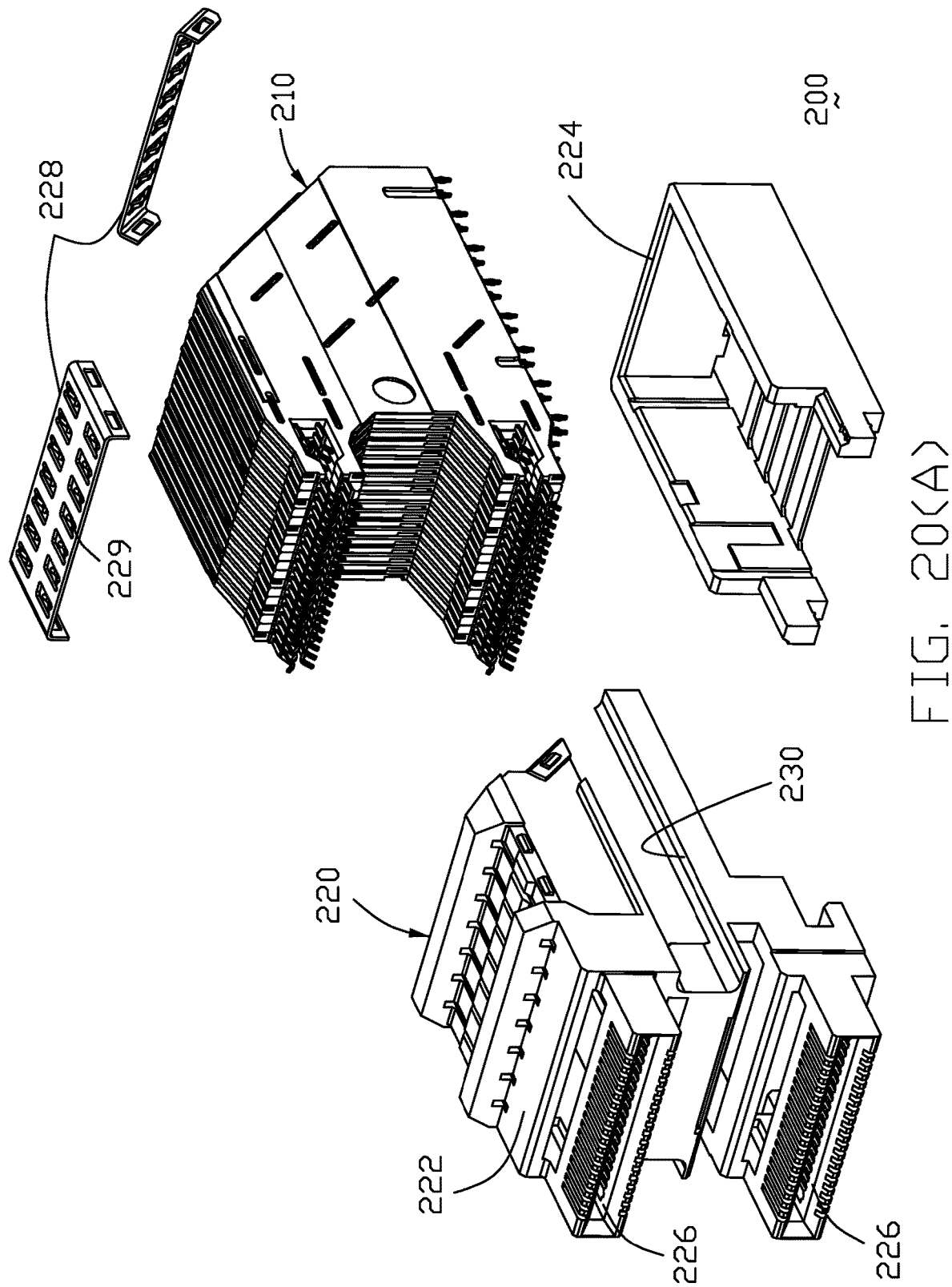
FIG. 20(A) is a further exploded perspective view of the receptacle connector of FIG. 19(A)
Figure 20B:
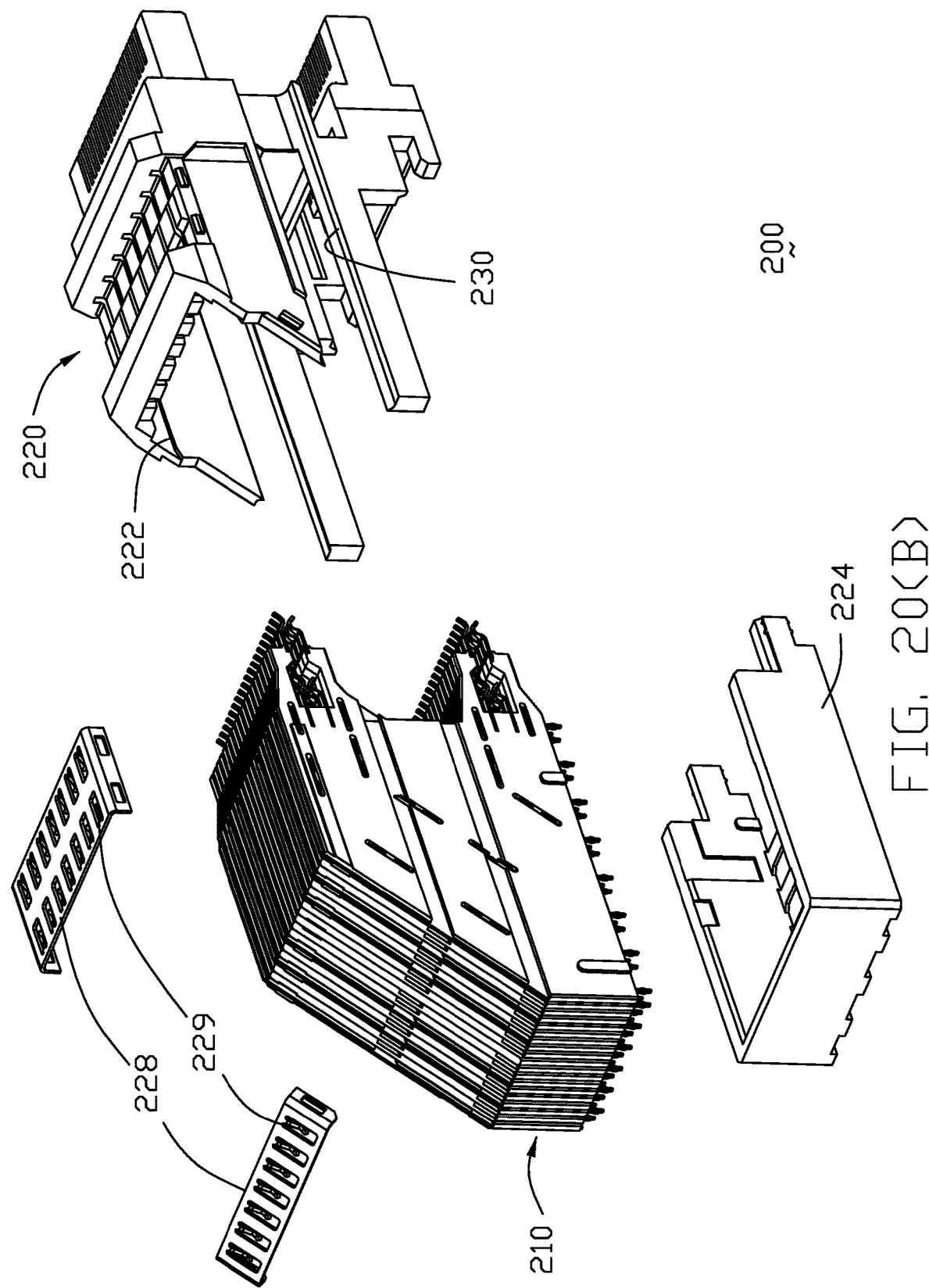
FIG. 20(B) is another further exploded perspective view of the receptacle connector of FIG. 19(B)
Figure 21A:
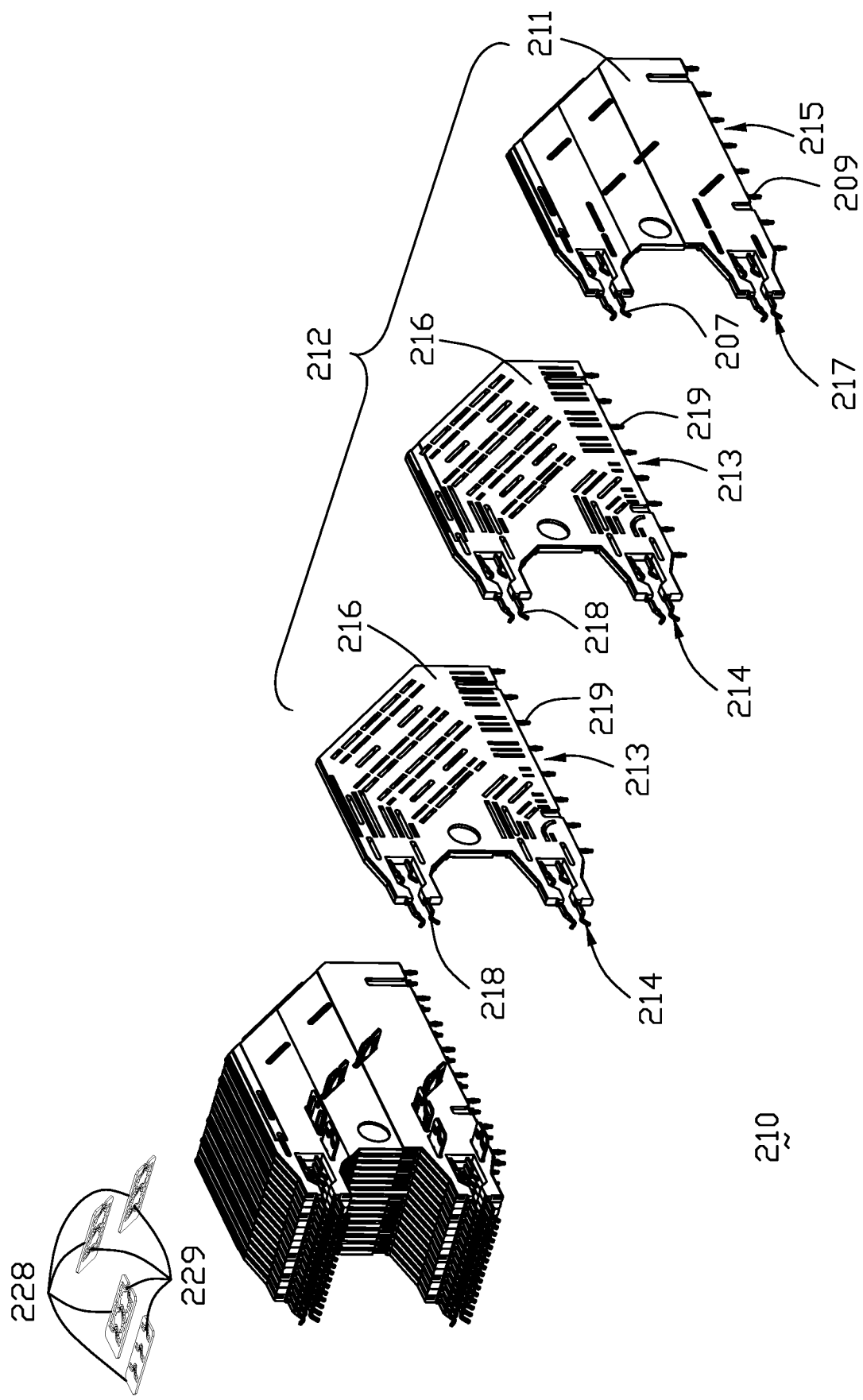
FIG. 21(A) is an exploded perspective view of the contact module of the receptacle connector of the electrical assembly of FIG. 18(A)
Figure 21B:
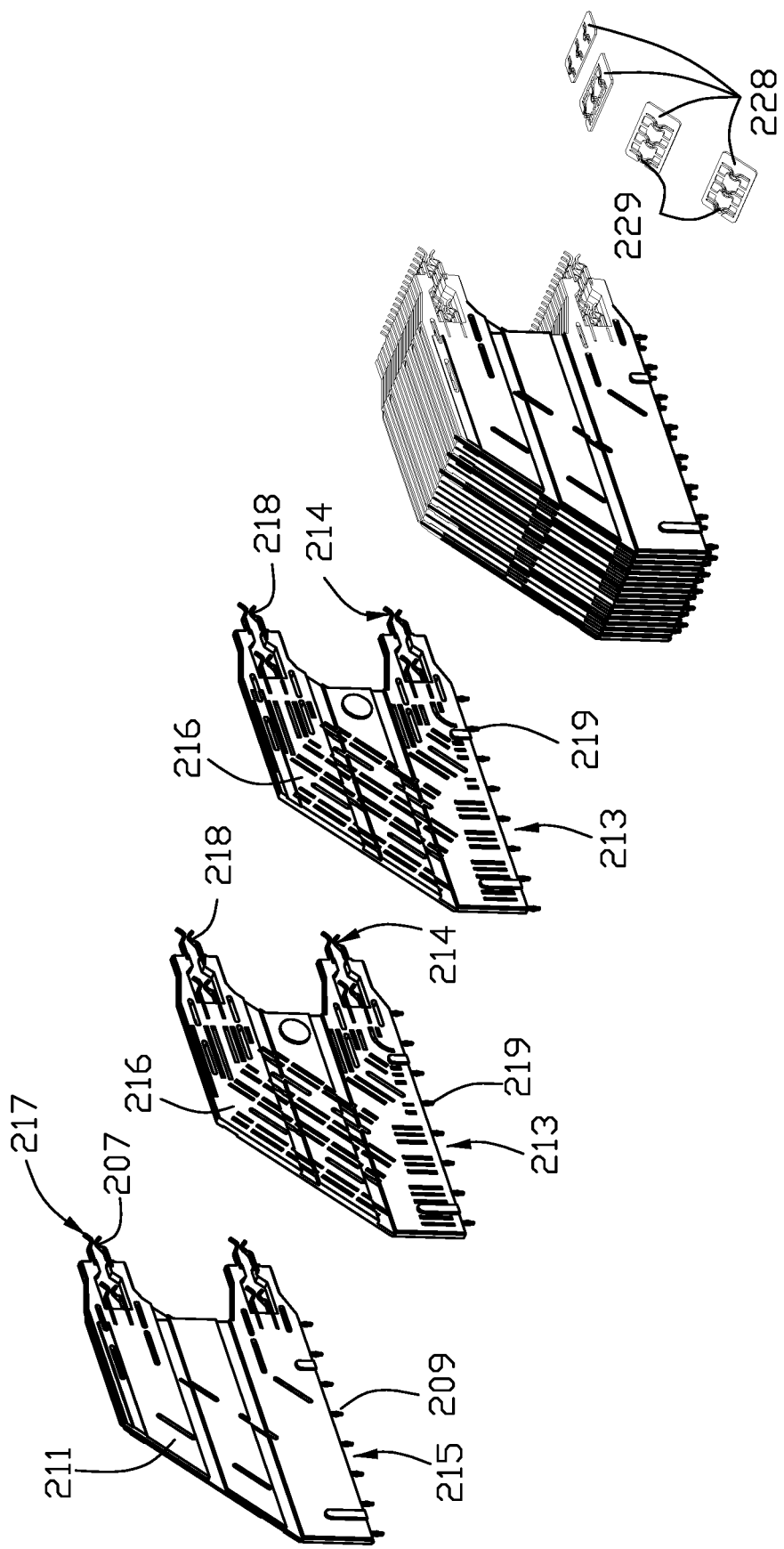
FIG. 21(B) is another exploded perspective view of the contact module of the receptacle connector of the electrical assembly of FIG. 21(A)
Figure 23:
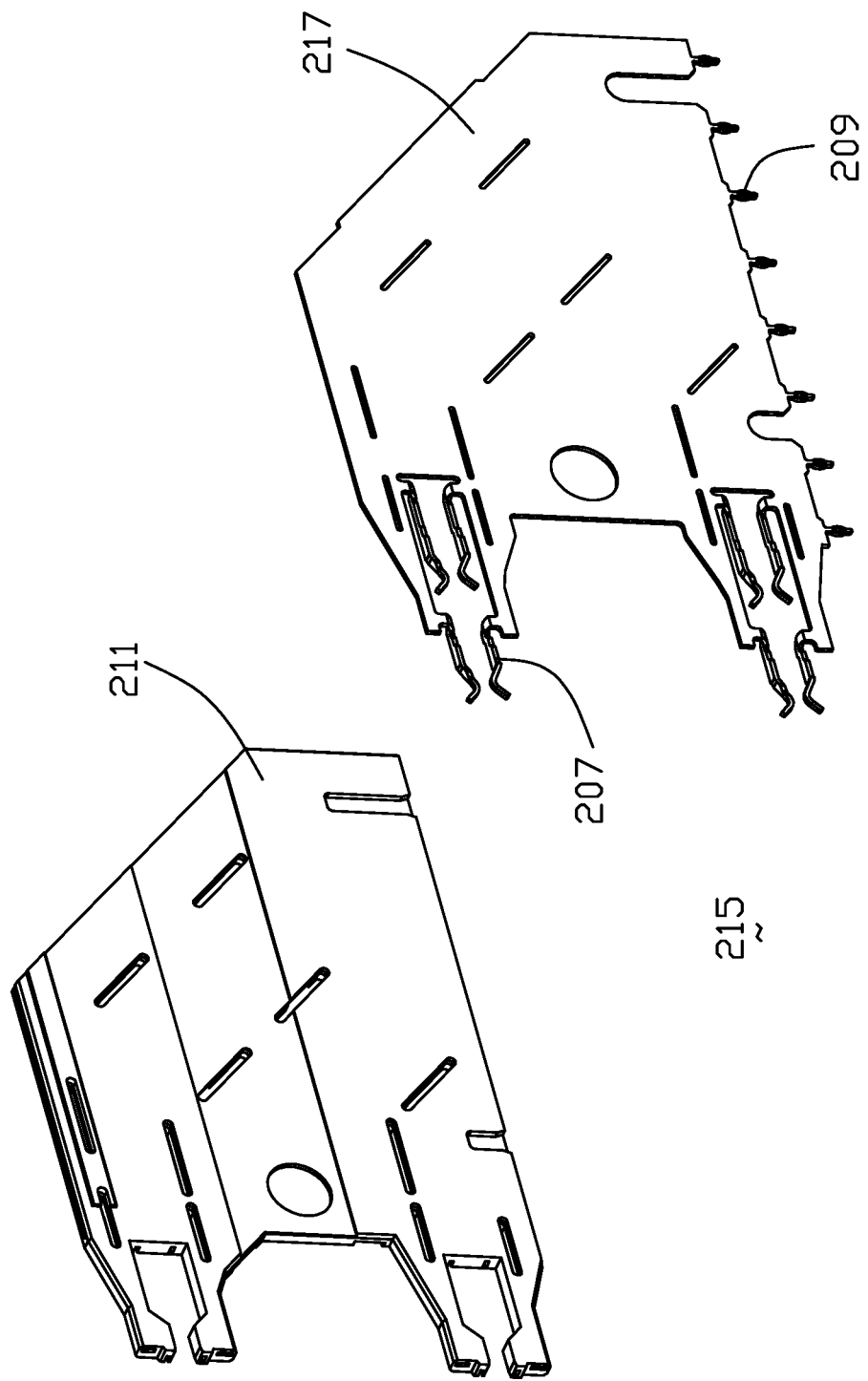
FIG. 23 is an exploded perspective view of the grounding unit of the contact module of the receptacle connector of the electrical assembly of FIG. 18(A)
Figure 24:
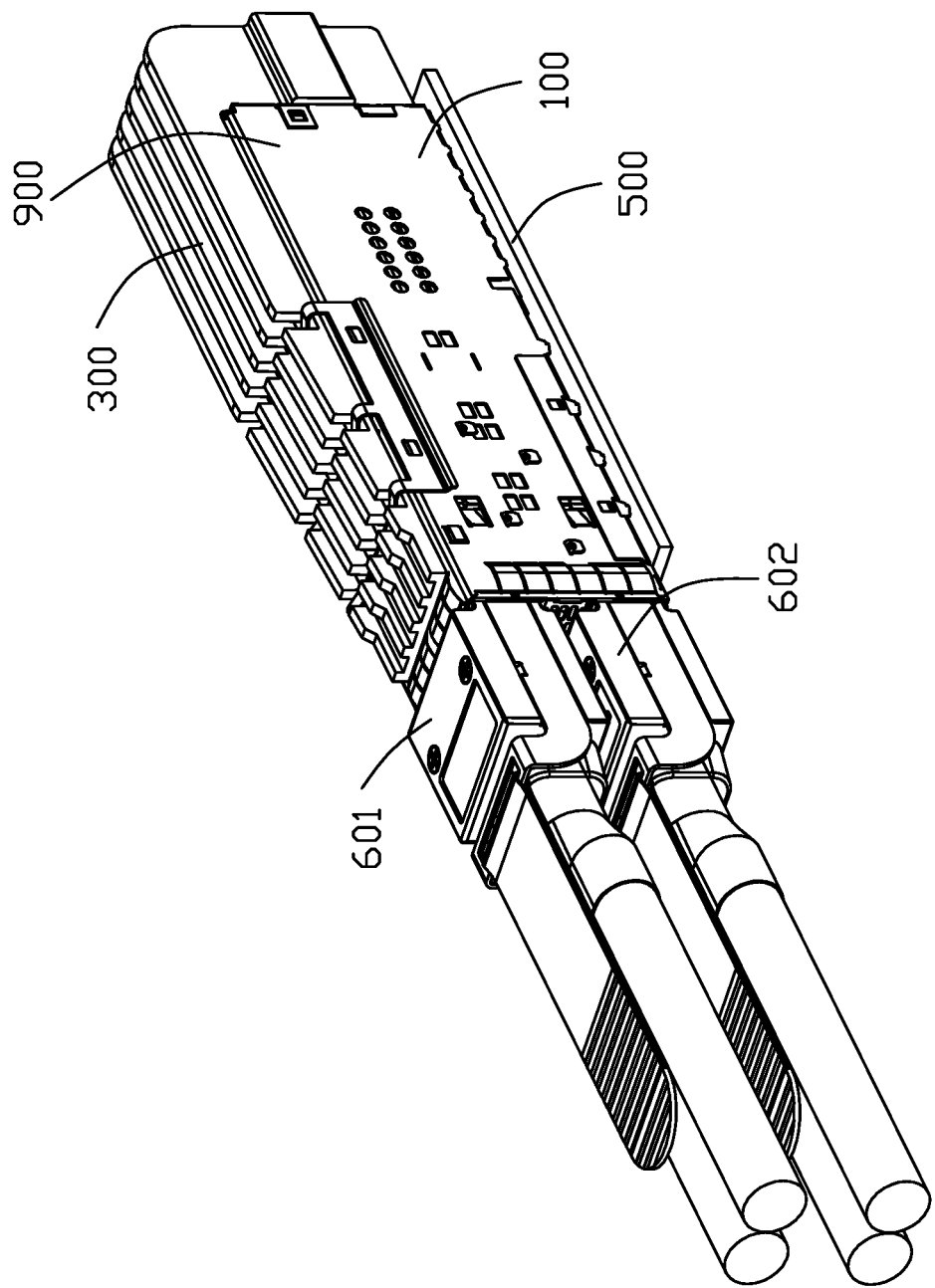
FIG. 24 is a perspective view of the electrical assembly mated with the upper plug module and the lower plug module.

Reference will now be made in detail to the preferred embodiments of the present invention. Referring to FIGS. 1-9, according to the first preferred embodiment invention, an electrical connector assembly 1, of which the basic structures may be referred to the previously filed provisional applications, includes a shielding shell or cage or metallic cage have a main body 10 with a bottom wall 12 to commonly form a space or receiving space 13 therein, and a receptacle connector or a receptacle connector unit 20 received in a rear end region or rear portion of the receiving space for mating with a plug module unit (not shown) which is adapted to be inserted into and received within the receiving space in front of the receptacle connector unit 20. The cage may comprise a plurality of faces or walls. The receptacle connector unit 20 may be referred to the previously filed provisional applications. The receptacle connector unit 20 may comprise a mating portion or a pair of mating portions 21 spaced apart from each other along a vertical direction and for being mated with an upper plug module and a lower plug module respectively. A gasket 14 surrounds a front edge region of the cage 10 for engagement with the panel of the communication equipment (not shown).

A middle heat transfer unit is located between the pair of mating portions 21, and includes a U-shaped metal structure 40 enclosing a thermal plastic or metal pad or heat block 43, and a pair of heat pipes 44 retained in the corresponding outer grooves of the thermal block 43 and extending along a front-to-back direction. The heat pipes 44 extend rearward out of a rear of the face of the cage to be mechanical and thermally connected to a rear heat sink unit 42 which is located on or associated with an outer side of rear of the faces of the cage. The rear heat sink unit 42 comprises a transverse bar 41 defines a pair of holes 46. The heat pipes 44 are received in the holes 46 in an intimately contacting manner and extend in the front-to-back direction, respectively. The middle heat transfer unit divides the receiving space 13 into an upper port 16 and a lower port 17 in the vertical direction and in communication with the pair of mating portions 21, respectively. The thermal block 43 forms a downward protrusion (not shown) on a bottom side. The U-shaped metal structure 40 forms an opening 45 to allow the downward protrusion of the thermal block 43 to extend downwardly for contacting the lower plug module which is adapted to be received within the lower port 17 of the cage. A top heat sink unit 30 is attached upon an outer side of the top of the walls of the cage 10 via a retainer clip 32, or is associated with the cage 10 by other mechanical structure. The cage forms an opening 19 to allow a downward protrusion (not shown) formed on a bottom side of the top heat sink 30 to contact the inserted upper plug module (not shown). A gasket 14 is attached upon a front end of the cage for compliantly abutting against a panel of the communication equipment through which the cage 10 extends and the inserted plug module units, respectively.

A heat conductive member such as an intermediate or corner heat pipe 50 is thermally connected between the top heat sink unit 30 and the rear heat sink unit 42 so as to form a heat transfer path loop among the upper plug module which is received within the upper port 16 of the receiving space, the top heat sink unit 30, the intermediate heat pipe 50, the rear sink unit 42 and the middle heat transfer unit. The intermediate heat pipe 50 comprises a horizontal portion 51 to directly contact with the top heat sink unit 30, and a vertical portion 52 extending from a rear end of the horizontal portion 51 to directly contact with the rear heat sink unit 42. The top heat sink unit 30 comprises a horizontal plate 31 seated upon the top of the faces of the cage, and a plurality of fins 33 extending along a front-to-back direction and spaced from one another in a transverse direction perpendicular to said front-to-back direction. Each of the fines 33 forms a tapered configuration. The rear heat sink unit 42 has manifold fins 47 with the long/high ones and the short/low ones alternately arranged with each other in the front-to-back direction.

Referring to FIGS. 10(A) to 24, according to the second preferred embodiment invention, generally speaking an electrical assembly 900 includes a metallic cage or cage 100 enclosing a receptacle connector 200 therein. Both the cage 100 and the receptacle connector 200 are commonly mounted upon a printed circuit board 500. An L-shaped unitary heat sink 300 is attached upon the cage 100 to cover both upper side and the rear side of the cage 100. A heat pipe subassembly 400 is disposed in a mid-level of the cage 100 and supportably retained by the receptacle connector 200 and extends through the heat sink 300 in an intimate manner. The detailed descriptions are given below.

The cage 100 includes a primary part 110 and a secondary part 130 assembled together. The primary part 110 includes a top face or wall 112, a pair of side faces 114 and a rear face 116 commonly forming a space 115 therein for receiving the receptacle connector 200 and two corresponding upper plug module 601 and lower plug module 602 (shown in FIG. 24). A plurality of legs 118 extend downwardly from a bottom edge of the primary part 110 for mounting to the printed circuit board 500. An opening 120 is formed in the top face 112. A frame type gasket 122 is attached to a front end of the cage 100.

Referring to FIGS. 18(A) to 23, the receptacle connector 200 similar to that disclosed in the previous provisional application 62/533,131, includes a contact module 210 enclosed within an insulative housing set 220. The contact module 210 includes a plurality of terminal wafer sets 212 stacked with one another along the transverse direction wherein each wafer set 212 includes a pair of signal wafers 213 and a grounding wafer 215. Each signal wafer 213 includes a plurality of signal contacts 214 embedded within an insulator 216. Each of the signal contacts 214 includes a front contacting section 218 and a rear mounting section 219. Each of the grounding wafers 215 includes a planar grounding contact 217 secured to an insulator 211 and having a front contacting section 207 and a rear mounting section 209. The housing set 220 includes a body 222 and a footer 224 assembled together. The body 222 forms a pair of mating cavities 226 in the vertical direction, into which the corresponding contacting sections 218 and 207 extend. A plurality of grounding plates 228 are attached to the housing set 220 and inserted into the contact module 210 in an intersection way with corresponding spring fingers 229 for contacting the grounding contacts 217.

Figure 25:
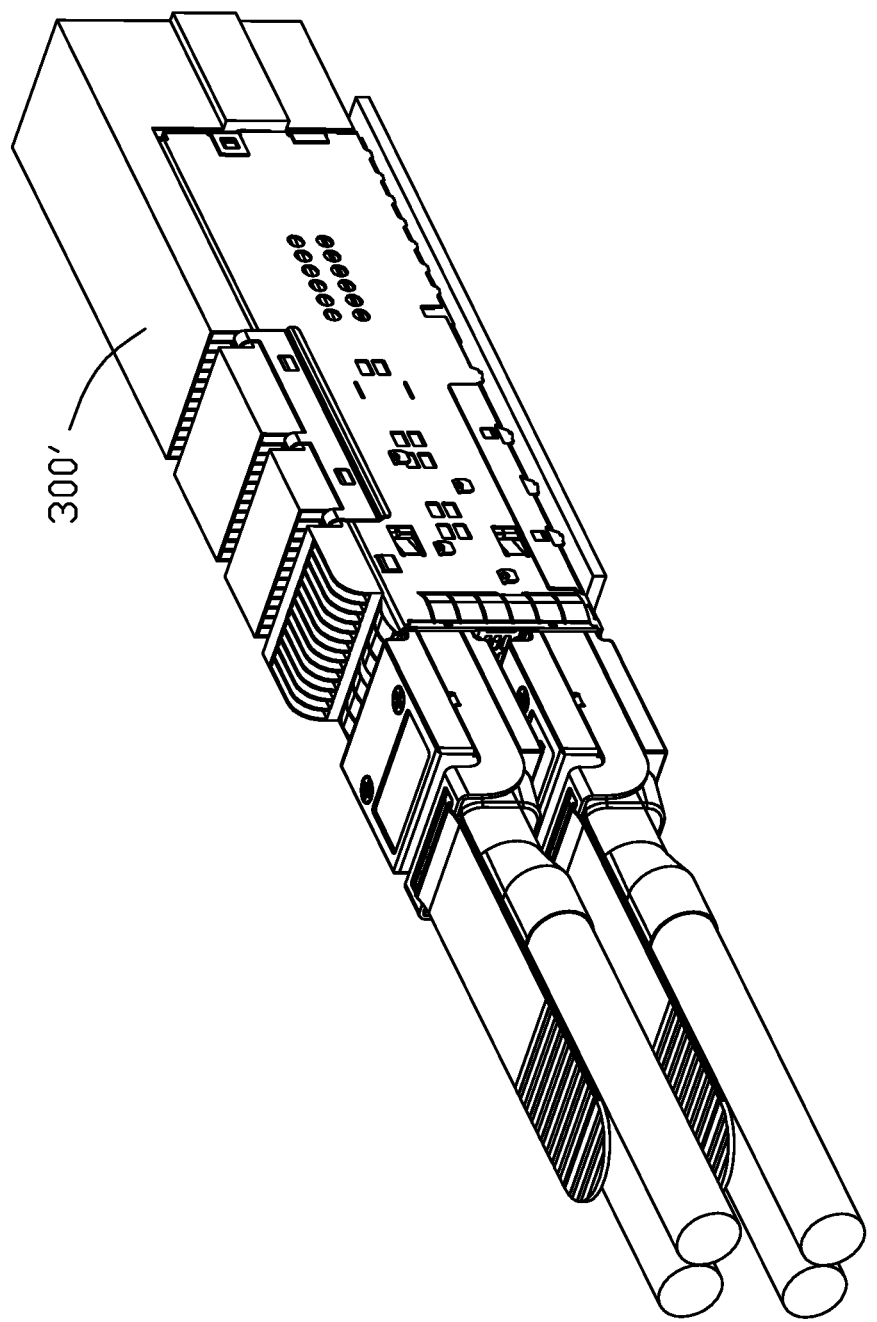
FIG. 25 is a perspective view of another embodiment of electrical assembly mated with the upper plug module and the lower plug module.

The heat sink 300 forms an L-shaped configuration with a horizontal segment 310 or first portion located upon the top face 112 of the cage 100, and a vertical segment 320 or a second portion located behind the rear face 116 of the cage 100, and includes a plurality of fins 330 extending along the front-to-back direction. To secure the parallel fins 330 together, the horizontal segment 310 includes a horizontal plate 312 seated upon the top face 112 and further extending rearwardly and terminated at the rear edge of the heat sink 300. Similarly, the vertical segment 320 includes a transverse bar 322 linking the parallel fins 330 and forming a pair of through holes 324 in two lateral sides. A downward protrusion 314 is formed under the horizontal plane 312 to extend downwardly through the opening 120 of the cage 100 for contacting the corresponding upper plug module 601 which is received within the upper port of the space of the cage 100 for removing the heat generated by that upper plug module. The horizontal segment 310 forms a plurality of slots 316 in which a detachable clip 318 is received to fasten the heat sink 300 to the cage 100. Notably, in the first embodiment of the previous provisional application, in the rear heat sink the plural transversely extending fins are unitarily formed with the horizontal immovable clip/base which not only secures the fins together but also provides the through holes to receive the corresponding heat pipes. In this embodiment, the fins 330 extend along the front-to-back direction from the front edge of the horizontal segment 310 to the rear edge of the vertical segment 320 with the horizontal bar 322 unitarily formed therewith not only securing the fins 330 together but also providing the pair of through holes 324 to receive the corresponding pair of heat pipes (illustrated later). Notably, in this embodiment, the upper edges of the fins 330 on the horizontal segment 310 are tapered for compliance with the heat dissipation. In this embodiment, the heat sink 300 is manufactured by extruded aluminum. In other embodiment, the heat sink 300' may be manufactured by stamped copper, which can be seen in FIG. 25.

The heat pipe subassembly 400 includes a heat block 410 retained in the U-shaped bracket 420 which is assembled to two side faces 114 of the cage 100, and a pair of heat pipes 430 located on two lateral sides of the heat block 410 and extending along the front-to-back direction and through the corresponding through holes 324. Notably, the heat pipe subassembly 400 divides the space in the cage 100 into the upper port 101 and the lower port 102 respectively aligned with the corresponding mating cavities 226 of the housing set 220 in the front-to-back direction for receiving the corresponding upper and lower plug modules 601, 602, respectively. The bracket 420 forms an opening 422 to allow the downward protrusion 412 of the block 410 to extend therethrough for contacting the corresponding lower plug module 602 which is received within a lower port 102 of the space of the cage 100 for removing heat generated by that lower plug module 602. Notably, the housing set 220 forms a pair of grooves 230 to receive the corresponding heat pipes 430, respectively.

Compared with what is disclosed in the previous provisional application 62/509,141, in the present embodiment the L-shaped unitary heat sink 300 structurally includes an additional corner part 350 to link together the top heat sink part and the rear sink part which are originally discrete from each other in the previous provisional application, thus not only increasing the heat dissipation areas but also efficiently guiding the heat transfer and further enhancing the strength of the whole heat sink set. By means of this arrangement, the heat dissipation by the top heat sink part which essentially absorbs the heat generated by the upper plug module 601 in the upper port 101 of the cage 100 and the heat dissipation by the rear heat sink part which essentially absorbs the heat generate by the lower plug module 602 in the lower port 102 of the cage 100 via the pair of heat pipes, can be joined together in a good circulation manner, compared with the individual dissipation disposed in the previous provisional application. Notably, the cooling air flow is directed to move in the slots between every adjacent two fins 330 along the front-to-back direction. Joined with the top heat sink part, i.e., the horizontal segment 310, by the corner part 350, the rear heat sink part, i.e., the vertical segment 320, may efficiently remove the heat transferred from the heat pipes 430 so as to assure the function of the lower plug module (not shown).

What is claimed is:

1. An electrical assembly comprising:
   a metallic cage including a plurality of faces to commonly form a receiving space;
   a receptacle connector located in a rear portion of the receiving space; and
   a heat sink member defining an L-shaped configuration in a side view and mounted on an outer side of the metallic cage, the heat sink member comprising a first portion attached on a top of the faces by a metallic clip, and a second portion located on a rear of the faces, the second portion being supportably retained to a pair of heat pipes which are respectively located by two sides of the receptacle connector in a transverse direction and between opposite upper and lower mating portions of the receptacle connector in a vertical direction;
   wherein the first portion and the second portion are thermally connected with each other by a third portion of the heat sink member.

2. The electrical assembly as claimed in claim 1, wherein the third portion is a heat conductive member.

3. The electrical assembly as claimed is claimed in 2, wherein the heat conductive member has a horizontal portion to directly contact with the first portion, and a vertical portion extending from a rear end of the horizontal portion to directly contact with the second portion.

4. The electrical assembly as claimed in claim 1, wherein the heat sink member is a unitary structure.

5. The electrical assembly as claimed in claim 1, wherein the receptacle connector comprises the upper and lower mating portions spaced apart from each other along the vertical direction and for being mated with an upper plug module and a lower plug module respectively, a middle heat transfer unit located between the pair of mating portions, the middle heat transfer unit comprising a heat block, the pair of heat pipes located on two opposite lateral sides of the heat block and extending along a front-to-back direction, the heat pipes extending through the rear of the faces to contact the second portion.

6. The electrical assembly as claimed 5, wherein the middle heat transfer unit divides the receiving space into an upper port and a lower port in the vertical direction and in communication with the pair of mating portions, respectively.

7. The electrical assembly as claimed in claim 6, wherein the first portion of the heat sink member forms a downward protrusion for contacting the upper plug module, and the heat block forms a downward protrusion for contacting the lower plug module.

8. The electrical assembly as claimed in claim 6, wherein the middle heat transfer unit further comprises a U-shaped bracket receiving said heat block therein, and said bracket forms an opening to allow a downward protrusion of the heat block to extend downwardly for contacting the lower plug module which is adapted to be received within the lower port of the cage.

9. The electrical assembly as claimed in claim 5, wherein the first portion of the heat sink member forms a transverse bar through which said pair of heat pipes extend in the front-to-back direction.

10. The electrical assembly as claimed in claim 1, wherein said third portion being a corner part linked between the first portion and the second portion for thermal connection therebetween, and said corner part is either of:
   a same material of the first portion and the second portion and unitarily formed with the first portion and the second portion, or
   of a corner heat pipe discrete from said first portion and said second portion so as to create a heat dissipation loop on the electrical assembly.

11. The electrical assembly as claimed in claim 10, wherein said corner part is the corner heat pipe, said corner heat pipe being of an L-shaped configuration.

12. A heat sink member for being used with an electrical assembly having a cage with a plurality of faces and a receptacle connector, comprising:
   a first portion for being attached on a top outer side of the faces by a metallic clip; and a second portion for being located on a rear outer side of the faces, the second portion is supportably retained to a pair of heat pipes which are respectively located by two sides of the receptacle connector in a transverse direction and between opposite upper and lower mating portions of the receptacle connector in a vertical direction; wherein
   the heat sink member defining an L-shaped configuration in a side view, and
   the first portion and the second portion are thermally connected with each other by a third portion of the heat sink member.

13. The heat sink member as claimed in claim 12, wherein the first portion extends along a horizontal direction, and the second portion extends along the vertical direction, the first portion comprising a plurality of fins extending along a front-to-back direction and spaced from one another in the transverse direction perpendicular to said front-to-back direction, each of said fins extending from a front edge to a rear edge, the first portion comprising a horizontal plate adapted to be seated upon a top of the face, and the second portion comprising a transverse bar defining two through holes for receiving the pair of heat pipes of the electrical assembly.

14. The heat sink member as claimed in claim 13, wherein each of said fins forms a tapered configuration.

15. An electrical assembly comprising:
   a metallic cage including a top face, a pair of side faces and a rear face to commonly form a receiving space;
   a receptacle connector located in a rear portion of the receiving space; and
   a heat sink member defining an L-shaped configuration in a side view and including a first portion intimately covering and attached to the top face by a metallic clip, a second portion intimately covering the rear face, the second portion is supportably retained to a pair of heat pipes which are respectively located by two sides of the receptacle connector in a transverse direction and between opposite upper and lower mating portions of the receptacle connector in a vertical direction, and a third portion joining the first portion and said second portion together.

16. The electrical assembly as claimed in claim 15, wherein said first portion of the heat sink member forms a plurality of fins extending along a front-to-back direction and spaced from one another in the transverse direction perpendicular to said front-to-back direction.

17. The electrical assembly as claimed in claim 16, wherein the first portion comprises a horizontal plate seated upon the top face of the cage, and the second portion comprises a transverse bar defining a pair or through holes.

18. The electrical assembly as claimed in claim 17, further comprising a heat pipe subassembly having a heat block and the pair of heat pipes located on two lateral sides of the heat block and extending through the pair of through holes in the front-to-back direction in an intimately contacting manner.

* * * * *